US009019035B2

(12) United States Patent
Ohhira

(10) Patent No.: US 9,019,035 B2
(45) Date of Patent: Apr. 28, 2015

(54) HIGH FREQUENCY WIRING BOARD COMPRISED OF INTERCONNECTED FIRST AND SECOND COPLANAR LINES ON DIFFERENT LAYERS AND HAVING A GROUND PATTERN PHYSICALLY SEPARATED THEREFROM

(75) Inventor: Risato Ohhira, Tokyo (JP)

(73) Assignee: NEC Corporation, Tokyo (JP)

( * ) Notice: Subject to any disclaimer, the term of this patent is extended or adjusted under 35 U.S.C. 154(b) by 99 days.

(21) Appl. No.: 12/674,221

(22) PCT Filed: Jul. 24, 2008

(86) PCT No.: PCT/JP2008/063283
§ 371 (c)(1),
(2), (4) Date: Feb. 19, 2010

(87) PCT Pub. No.: WO2009/037918
PCT Pub. Date: Mar. 26, 2009

(65) Prior Publication Data
US 2011/0128100 A1    Jun. 2, 2011

(30) Foreign Application Priority Data

Sep. 18, 2007  (JP) ................. 2007-241104

(51) Int. Cl.
*H01P 3/08*     (2006.01)
*H05K 1/02*     (2006.01)
*H01P 1/04*     (2006.01)
*H01L 23/66*    (2006.01)

(52) U.S. Cl.
CPC ............... *H05K 1/0219* (2013.01); *H01P 3/08* (2013.01); *H01L 23/66* (2013.01); *H01L 2223/6616* (2013.01); *H01L 2223/6627* (2013.01); *H01L 2224/48227* (2013.01); *H01L 2924/09701* (2013.01); *H01L 2924/19033* (2013.01); *H01P 1/047* (2013.01); *H05K 1/0253* (2013.01); *H05K 1/0298* (2013.01); *H05K 2201/0715* (2013.01); *H05K 2201/093* (2013.01);
(Continued)

(58) Field of Classification Search
USPC .............................. 333/246, 238, 33
See application file for complete search history.

(56) References Cited

U.S. PATENT DOCUMENTS 5,994,983 A * 11/1999 Andersson .............. 333/246
2006/0214744 A1 * 9/2006 Margomenos ............ 333/33

FOREIGN PATENT DOCUMENTS

| JP | 2003133472 A | 5/2003 |
| JP | 2004247980 A | 9/2004 |

(Continued)

OTHER PUBLICATIONS

International Search Report for PCT/JP2008/063283 mailed Oct. 28, 2008.

*Primary Examiner* — Benny Lee
(74) *Attorney, Agent, or Firm* — Sughrue Mion, PLLC

(57) ABSTRACT

The high-frequency wiring board of the present invention includes: first coplanar lines provided with a first signal line and a first planar ground pattern formed on the same wiring layer as the first signal line; second coplanar lines provided with a second signal line formed on a different wiring layer than the first signal line and a second planar ground pattern formed on the same wiring layer as the second signal line; and a first ground pattern formed on the same wiring layer as the first coplanar lines. The first coplanar lines and the second coplanar lines are connected. At least the first ground pattern and the first planar ground pattern are separated in a region following the second signal line from the connection of the first signal line and the second signal line.

12 Claims, 13 Drawing Sheets

(52) U.S. Cl.
CPC ............... *H05K 2201/09363* (2013.01); *H05K 2201/09618* (2013.01); *H05K 2201/09663* (2013.01); *H01L 2924/01019* (2013.01); *H01L 2224/48091* (2013.01); *H01L 2924/3011* (2013.01)

(56) References Cited

FOREIGN PATENT DOCUMENTS

| | | |
|---|---|---|
| JP | 2004320109 A | 11/2004 |
| JP | 2005094445 A | 4/2005 |

* cited by examiner

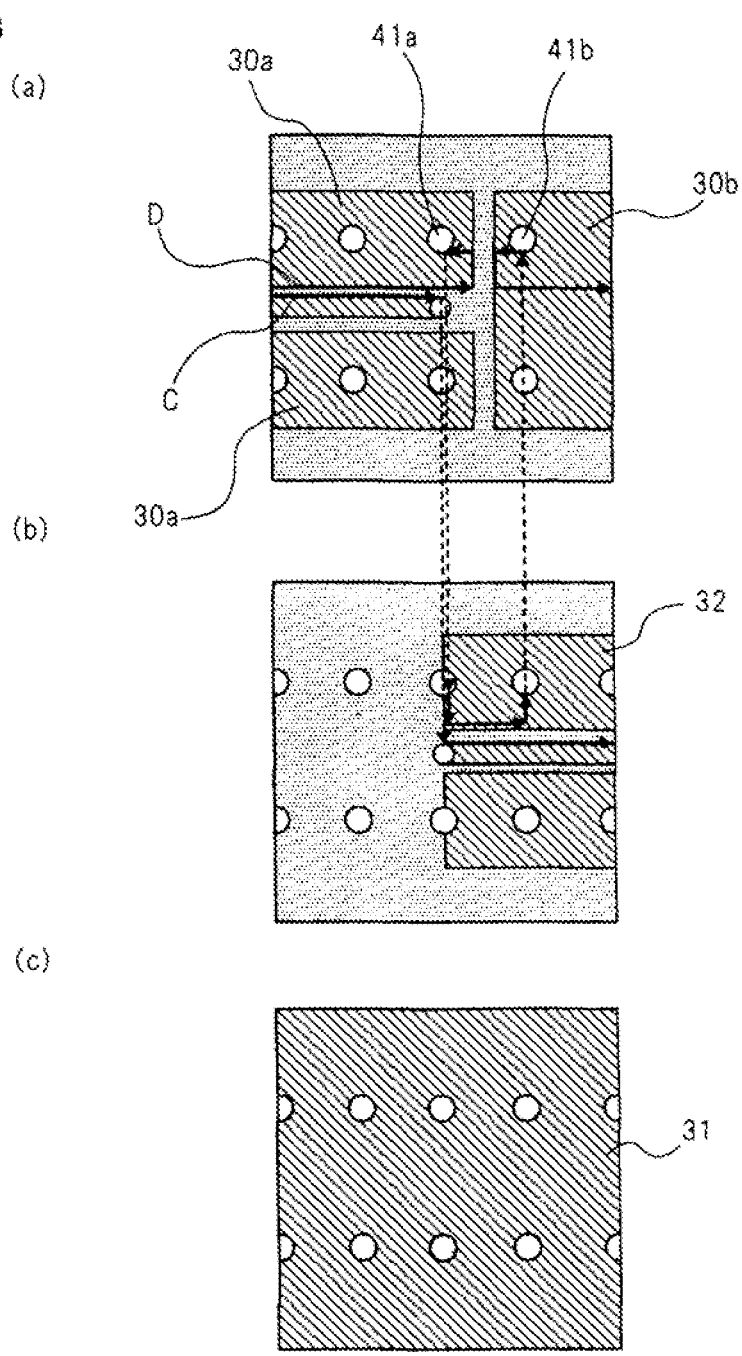

Fig. 4
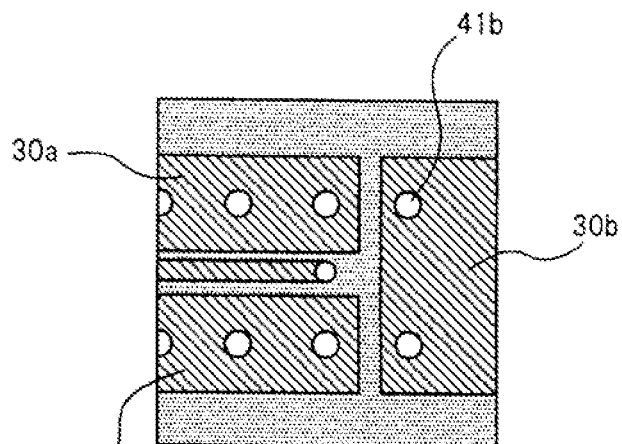
(a)
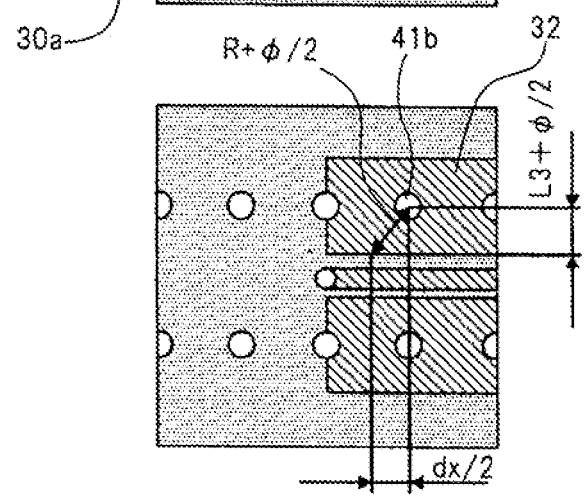
(b)
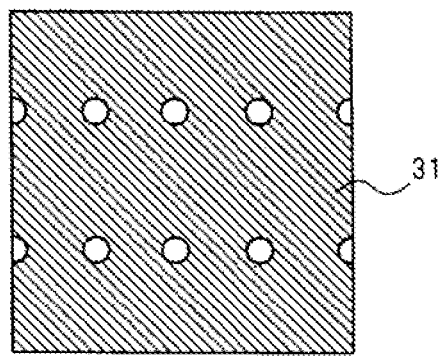
(c)

US 9,019,035 B2

HIGH FREQUENCY WIRING BOARD COMPRISED OF INTERCONNECTED FIRST AND SECOND COPLANAR LINES ON DIFFERENT LAYERS AND HAVING A GROUND PATTERN PHYSICALLY SEPARATED THEREFROM

This application is the National Phase of PCT/JP2008/063283, filed Jul. 24, 2008, which claims priority based on Japanese Patent Application 2007-241104 for which application was submitted on Sep. 18, 2007 and incorporates all of the disclosures of that application.

TECHNICAL FIELD

The present invention relates to a high-frequency wiring board on which high-frequency transmission lines are formed, and more particularly, relates the to interconnection of high-frequency transmission lines that are formed on different layers of a wiring board.

BACKGROUND ART

In high-frequency transmission lines used in, for example, packages for high-frequency semiconductor elements or wiring boards for circuit element mounting, the mounting positions of electronic components, surface lines that are formed on the surface of a dielectric wiring board, and internal lines that are formed in the interior of a dielectric wiring board are frequently interconnected.

Representative examples of surface lines that are formed on the surface of a dielectric wiring board include microstrip lines and coplanar lines. In addition, representative examples of inner-layer lines that are formed inside a dielectric wiring board include strip lines and coplanar lines. Further, regarding interconnections between surface lines and inner-layer lines, connections are realized by vias or through-holes having conductivity.

As an example, the high-frequency wiring board described in JP-A-2003-133472 (hereinbelow referred to as Patent Document 1) has high-frequency transmission lines as shown in FIGS. 1A-1D. FIG. 1A is an overall perspective view of the high-frequency wiring board, FIG. 1B is a perspective view of the second dielectric layer portion of the high-frequency wiring board, FIG. 1C is an upper plan view of the reverse-surface conductive pattern of the high-frequency wiring board, and FIG. 1D is a sectional view taken along line X-X in the direction of signal transmission of the high-frequency wiring board shown in FIG. 1A.

The high-frequency wiring board shown in these figures is composed of dielectric wiring board 20 (FIG. 1A) realized by stacking two dielectric layers 20a (FIG. 1A) and 20b (FIGS. 1A and 1B). High-frequency transmission lines are then formed on different layers.

The first high-frequency transmission lines are made up from: first signal lines 10 (FIG. 1A) formed on the upper surface of first dielectric layer 20a (FIG. 1A) that is the obverse surface of dielectric wiring board 20 (FIG. 1A), first ground pattern 30 (FIGS. 1A and 1D) that is arranged around these signal lines 10 (FIG. 1A) and on the same surface, and second ground pattern 32 (FIGS. 1A, 1B, and 1D) formed on the surface of second dielectric layer 20b (FIGS. 1A and 1B). In addition, second high-frequency transmission lines are made up from the above-described first ground pattern 30 (FIGS. 1A and 1D), third ground pattern 31 (FIGS. 1A and 1C) formed on the lower surface of second dielectric layer 20b (FIGS. 1A and 1B) that is the reverse surface of dielectric wiring board 20 (FIG. 1A), second signal line 11 (FIG. 1B) formed on the upper surface of second dielectric layer 20b (FIGS. 1A and 1B) and arranged between these ground patterns, and second ground pattern 32 (FIGS. 1A, 1B, and 1D) that is arranged around this signal line 11 (FIG. 1B) and on the same surface.

The end of first signal line 10 (FIG. 1A) of the first high-frequency transmission lines and the end of second signal line 11 (FIG. 1B) of the second high-frequency transmission lines are connected by via 40 (FIG. 1A) having conductivity. In addition, first ground pattern 30 (FIGS. 1A and 1D), second ground pattern 32 (FIGS. 1A, 1B, and 1D), and third ground pattern 31 (FIGS. 1A and 1C) are electrically connected by a plurality of conductive vias 41 arranged along the signal transmission direction of first signal lines 10 (FIG. 1A) and second signal line 11 (FIG. 1B).

However, when different line constructions are connected together, as with first high-frequency transmission lines and second high-frequency transmission lines, mismatching tends to occur in the vicinity of the connections, and as a result, signal reflection tends to occur increasingly as the frequency of signals increases.

As a result, methods have been proposed as in, for example, JP-A-2004-320109 (hereinbelow referred to as Patent Document 2) for limiting impedance mismatching and thus decreasing signal reflection by changing the end width of signal lines that correspond to first signal lines 10 (FIG. 1A) that make up the above-described first high-frequency transmission lines, i.e., changing the width in the vicinity of connections with conductive vias 40 (FIG. 1A).

Patent Document 1: JP-A-2003-133472 (FIG. 5)
Patent Document 2: JP-A-2004-320109 (FIG. 1, paragraph 0095)

As described hereinabove, when connecting signal lines of different types in which signal lines are formed on different layers in the configuration shown in FIGS. 1A-1D, changing the signal line width in the vicinities of conductive vias that interconnect signal lines results in an improvement of the signal pass characteristic (also called reflection characteristics). However, it was found that the problem in which the signal pass characteristic (also called the reflection characteristics) deteriorated as the transmission signal went from a low frequency to higher frequencies could not be solved in this related art.

The reasons for this problem are next explained with reference to FIG. 1D.

In the configuration shown by FIGS. 1A-1D, when a signal is transmitted from the first high-frequency transmission lines to the second high-frequency transmission lines, the signal-line component of the current among the high-frequency current that is propagated over first ground pattern 30 (FIGS. 1A and 1D) and first signal line 10 (FIG. 1A) of the first high-frequency transmission lines flows along second signal line 11 (FIG. 1B) of the second high-frequency transmission lines. However, the ground-pattern component of the current not only flows through second ground pattern 32 (FIGS. 1A, 1B, and 1D) of the second high-frequency transmission lines but also through first ground pattern 30 (FIGS. 1A and 1D), i.e., in two paths. In other words, as shown in FIG. 1D, the current is propagated on path A that passes by only first ground pattern 30 (FIGS. 1A and 1D) and on path B that passes successively from first ground pattern 30 (FIGS. 1A and 1D) to conductive via 41a (FIG. 1D), second ground pattern 32 (FIGS. 1A, 1B, and 1D), and the next conductive via 41b (FIG. 1D) along the signal transmission direction before again returning to first ground pattern 30 (FIGS. 1A and 1D).

If the physical path lengths of paths A and B are L1 and L2, respectively as shown in FIG. 1D, then the path length difference L1-L2 is ΔL, the wavelength of signal transmission in a vacuum is λ0, the wave number of each path is the same at k, and the effective relative dielectric constants on each path are the same at ∈, the phase difference between the two paths A and B is represented by:

[Formula 1]

$$k \times L1 - k \times L2 = k \times \Delta L = \left(\frac{2\pi}{\lambda 0 / \sqrt{\varepsilon}}\right) \times \Delta L = (2\pi \times \sqrt{\varepsilon}) \times \left(\frac{\Delta L}{\lambda 0}\right) \quad (1)$$

and is proportional to ΔL/λ0.

As a result, even if the physical path length difference ΔL is fixed, interpath phase difference tends to increase and phase difference more readily occurs as the transmission signal progresses from a low frequency to a higher frequency, i.e., with shorter wavelength of wavelength λ0.

Essentially, it was found that even when adopting the method taught in Patent Document 2, the potential for improving the reflection characteristics of signal transmission from the first high-frequency transmission lines to the second high-frequency transmission lines in the configuration shown in FIGS. 1A-1D diminishes with higher frequencies.

SUMMARY OF EMBODIMENTS OF THE INVENTION

It is an object of the present invention to solve the problems inherent in the above-described background art. One example of this object is to provide a construction that enables an improvement of reflection characteristics from a low-frequency region to a high-frequency region in a high-frequency wiring board equipped with different types of high-frequency lines that are formed on different layers and that are interconnected.

The high-frequency wiring board of the present invention relates to a high-frequency wiring board in which first coplanar lines and second coplanar lines are connected, one mode of the invention being as next described. The first coplanar lines are lines provided with a first signal line and a first planar ground pattern formed on the same wiring layer as the first signal line. The second coplanar lines are lines provided with a second signal line formed on a wiring layer that differs from the first signal line and a second planar ground pattern formed on the same wiring layer as the second signal line. A first ground pattern is formed on the same wiring layer as the first coplanar lines. The present invention is characterized in that, in this high-frequency wiring board, the first ground pattern and the first planar ground pattern are separated in at least a region that follows the second signal line from the connection between the ends of the first signal line and the second signal line.

In yet another mode of the present invention, the first signal line and the second signal line are connected by a first conductive via at the line end of each signal line.

A plurality of second conductive vias are then arranged at a predetermined spacing along the signal transmission direction that passes through the first and second coplanar lines and among these conductive vias are included: conductive vias a for connecting the planar ground pattern of the first coplanar lines and the planar ground pattern of the second coplanar lines; conductive vias b for connecting the first ground pattern and the planar ground pattern of the second coplanar lines; and conductive vias c for connecting the planar ground pattern of the first coplanar lines and the second ground pattern.

BRIEF DESCRIPTION OF THE DRAWINGS

FIGS. 3(a), 3(b), and 3(c) give a schematic representation of the signal-line component of the high-frequency current paths and the ground-pattern component of the high-frequency current paths based on the results of electromagnetic field analysis of the high-frequency transmission line construction of the first embodiment;

FIGS. 4(a), 4(b), and 4(c) are an explanatory view of the spacing range of conductive vias arranged along the direction of signal transmission in the high-frequency transmission line construction of the first embodiment;

BEST MODE FOR CARRYING OUT THE INVENTION

Explanation next regards details of embodiments of the present invention with reference to the accompanying figures, where like features in the different drawing figures are designated by the same reference labels and may not be described in detail for each drawing figure in which they appear.

First Embodiment

Figure 1A:
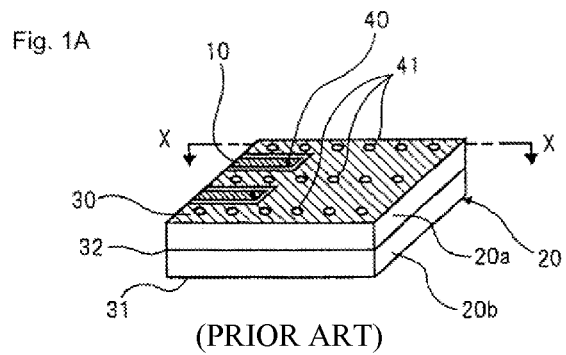
FIG. 1A is an overall perspective view of the high-frequency wiring board disclosed in Patent Document 1.
Figure 1B:
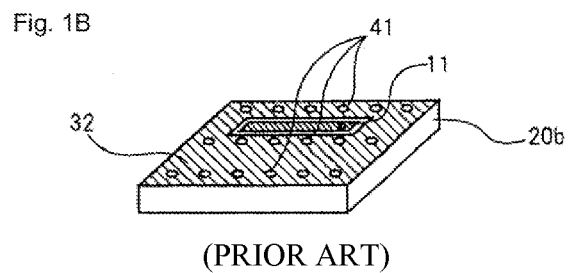
FIG. 1B is a perspective view of a portion of the second dielectric layer of the high-frequency wiring board of FIG. 1A.
Figure 1C:
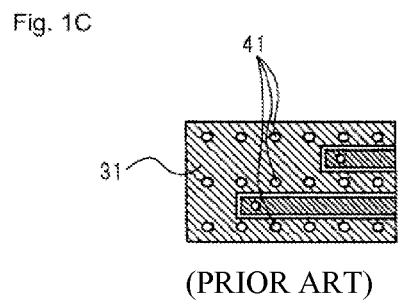
FIG. 1C is an upper view of the reverse-surface conductive pattern of the high-frequency wiring board of FIG. 1A.
Figure 1D:
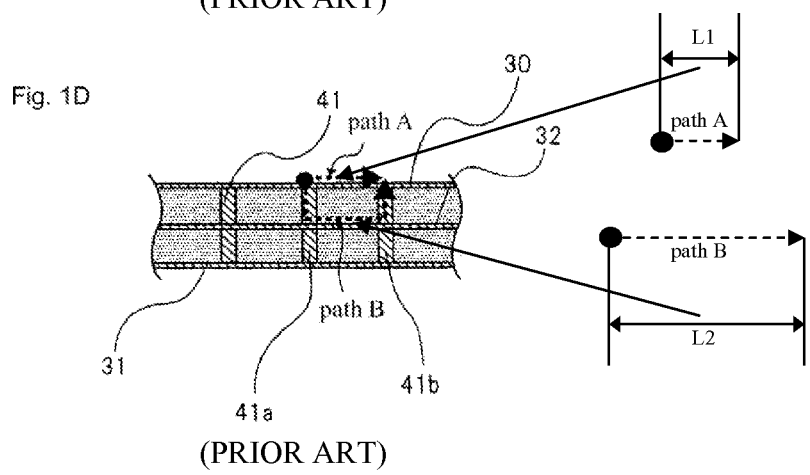
FIG. 1D is a sectional view taken along line X-X along the direction of signal transmission of the high-frequency wiring board shown in FIG. 1A.
Figure 2A:
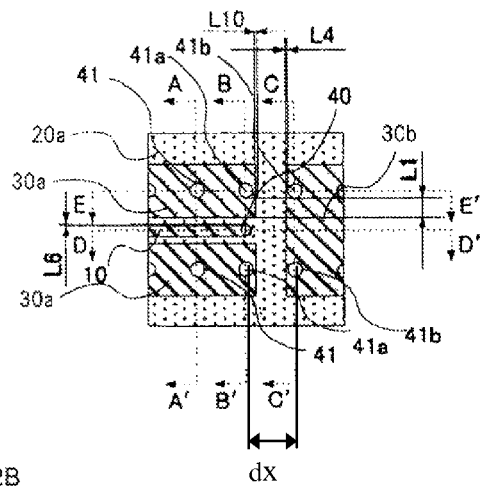
FIG. 2A is a plan view showing the first wiring layer of the high-frequency wiring board of the first embodiment.
Figure 2B:
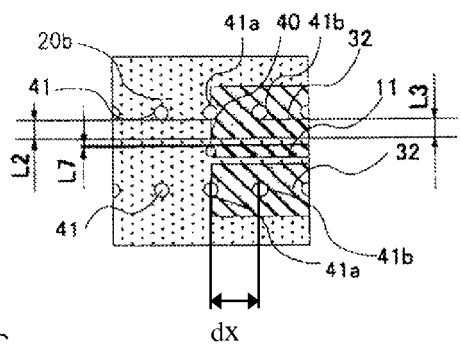
FIG. 2B is a plan view showing the second wiring layer of the high-frequency wiring board of the first embodiment.
Figure 2C:
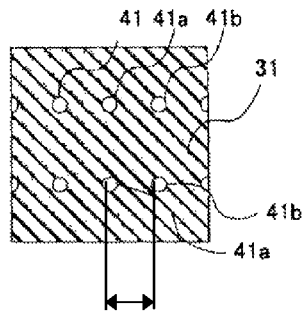
FIG. 2C is a plan view showing the third wiring layer of the high-frequency wiring board of the first embodiment.
Figure 2D:
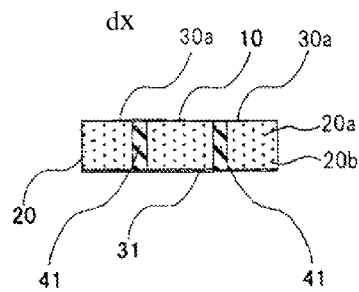
FIG. 2D is a sectional view of the high-frequency wiring board taken along line A-A' of FIG. 2A.
Figure 2E:
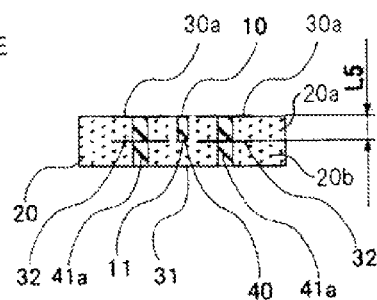
FIG. 2E is a sectional view of the high-frequency wiring board taken along line B-B' of FIG. 2A.
Figure 2F:
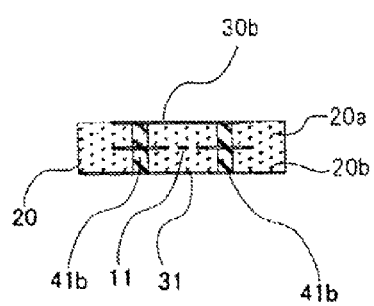
FIG. 2F is a sectional view of the high-frequency wiring board taken along line C-C' of FIG. 2A.
Figure 2G:
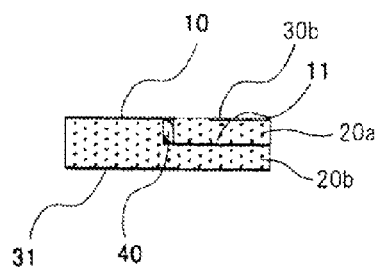
FIG. 2G is a sectional view of the high-frequency wiring board taken along line D-D' of FIG. 2A.
Figure 2H:
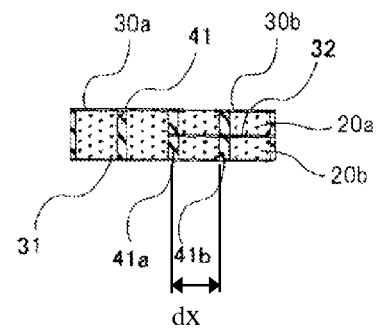
FIG. 2H is a sectional view of the high-frequency wiring board taken along line E-E' of FIG. 2A.

FIGS. 2A-2H show the construction of the high-frequency wiring board according to the first embodiment of the present invention. To state in greater detail, FIG. 2A is a plan view showing the first wiring layer of the high-frequency wiring board of the present embodiment; FIG. 2B is a plan view of the second wiring layer, and FIG. 2C is a plan view of the third wiring layer. FIG. 2D is a section of the board taken along line A-A' of FIG. 2A, FIG. 2E is a section of the board taken along line B-B' of FIG. 2A, FIG. 2F is a section of the board taken along line C-C' of FIG. 2A, FIG. 2G is a section of the board taken along line D-D' of FIG. 2A, and FIG. 2H is a section of the board taken along line E-E' of FIG. 2A. In each figure, the same reference numbers are used for functional parts that are the same as constituent elements shown in FIGS. 1A-1D.

The high-frequency wiring board of the present embodiment is composed of dielectric wiring board 20 in which two dielectric layers 20a (FIGS. 2A, 2D-2G) and 20b (FIGS. 2B, 2D-2G) are stacked. First coplanar lines are formed on the upper surface of first dielectric layer 20a (FIGS. 2A, 2D-2G) that is the obverse surface (first wiring layer) of dielectric wiring board 20 (FIGS. 2D-2F). These first coplanar lines are made up from first signal line 10 (FIGS. 2A, 2D, 2E, and 2G) and planar ground pattern 30a (FIGS. 2A, 2D, 2E, and 2H) that is formed on both sides of first signal line 10 (FIGS. 2A, 2D, 2E, and 2G) and on the same layer as first signal line 10 (FIGS. 2A, 2D, 2E, and 2G). In addition, second coplanar lines are formed on the upper surface of second dielectric layer 20b (FIGS. 2B, 2D-2G) that is the internal layer (second wiring layer) of dielectric wiring board 20 (FIGS. 2D-2F). The second coplanar lines are made up from second signal line 11 (FIGS. 2B, 2F, and 2G) and planar ground pattern 32 (FIGS. 2B, 2E, and 2H) that is formed on both sides of this signal line 11 (FIGS. 2B, 2F, and 2G) and on the same layer as second signal line 11 (FIGS. 2B, 2F, and 2G). In addition, planar ground patterns 30a (FIGS. 2A, 2D, 2E, and 2H) and 32 (FIGS. 2B, 2E, and 2H) of the first and second coplanar lines may be formed on only one of the two side positions that sandwiches each of the signal lines.

First signal line 10 (FIGS. 2A, 2D, 2E, and 2G) of the first coplanar lines and second signal line 11 (FIGS. 2B, 2F, and 2G) of the second coplanar lines that is on a wiring layer that differs from that of first signal line 10 (FIGS. 2A, 2D, 2E, and 2G) are connected at conductive via 40 (FIGS. 2A, 2B, 2E, and 2G) at the line end of each signal line.

Planar first ground pattern 30b (FIGS. 2A, 2F, 2G and 2H) and planar second ground pattern 31 (FIGS. 2C-2H) are formed on the first wiring layer and third wiring layer (the reverse surface of dielectric wiring board 20 (FIGS. 2D-2F)) such that the layer on which second signal line 11 (FIGS. 2B, 2F, and 2G) is formed is sandwiched from above and below. This second ground pattern 31 (FIGS. 2C-2H) extends to areas that confront the first coplanar lines and further serves as the lower-layer ground of the first coplanar lines.

On the other hand, first ground pattern 30b (FIGS. 2A, 2F, 2G and 2H) is separated from ground pattern 30a (FIGS. 2A, 2D, 2E, and 2H) without doing double-duty as the ground pattern of the first coplanar lines as in the background art. More specifically, planar ground pattern 30a (FIGS. 2A, 2D, 2E, and 2H) of the first coplanar lines and first ground pattern 30b (FIGS. 2A, 2F, 2G and 2H) of the upper layer of second coplanar lines are separated by a predetermined width (dielectric width) from the area of connection of first signal line 10 (FIGS. 2A, 2D, 2E, and 2G) and conductive via 40 (FIGS. 2A, 2B, 2E, and 2G) in the direction of the extension of the second coplanar lines.

Planar ground pattern 30a (FIGS. 2A, 2D, 2E, and 2H) of the first coplanar lines and second ground pattern 31 (FIGS. 2C-2H) that further serves as the lower-layer ground of the first coplanar lines are interconnected by a plurality of conductive vias 41 (FIGS. 2A-2D and 2H) arranged at a predetermined spacing along the signal transmission direction of the first coplanar lines. However, of the plurality of conductive vias 41 (FIGS. 2A-2D and 2H), conductive vias 41a (FIGS. 2A-2C, 2E and 2H) in the vicinity of the connection of first signal line 10 (FIGS. 2A, 2D, 2E, and 2G) and second signal line 11 (FIGS. 2B, 2F, and 2G) are interconnected between planar ground pattern 30a (FIGS. 2A, 2D, 2E, and 2H) of the first coplanar lines and planar ground pattern 32 (FIGS. 2B, 2E, and 2H) of the second coplanar lines.

In addition, first ground pattern 30b (FIGS. 2A, 2F, 2G and 2H) that is on the upper layer of the second coplanar lines, planar ground pattern 32 (FIGS. 2B, 2E, and 2H) of the second coplanar lines, and second ground pattern 31 (FIGS. 2C-2H) are mutually connected by a plurality of conductive vias 41 (FIGS. 2A-2D and 2H) (41b) (FIGS. 2A-2C, and 2F) arranged at a predetermined spacing along the signal transmission direction of the second coplanar lines.

In the high-frequency transmission lines of the high-frequency wiring board as described above, planar ground pattern 30a (FIGS. 2A, 2D, 2E, and 2H) of the first coplanar lines and first ground pattern 30b (FIGS. 2A, 2F, 2G and 2H) of the upper layer of the second coplanar lines are separated in the direction of the extension of the second coplanar lines from the vicinity of the connection of first signal line 10 (FIGS. 2A, 2D, 2E, and 2G) and conductive via 40 (FIGS. 2A, 2B, 2E, and 2G).

As a result, when a signal is transmitted from the first coplanar lines to the second coplanar lines, the high-frequency current paths that are propagated in the first ground pattern 30b (FIGS. 2A, 2F, 2G and 2H) of the upper layer of the second coplanar lines are limited to one. In other words, the high-frequency current path that is propagated in first ground pattern 30b (FIGS. 2A, 2F, 2G and 2H) during signal transmission to the second coplanar lines is only the path toward first ground pattern 30b (FIGS. 2A, 2F, 2G and 2H) that successively passes from planar ground pattern 30a (FIGS. 2A, 2D, 2E, and 2H) of the first coplanar lines, by way of conductive vias 41a (FIGS. 2A-2C, 2E, and 2H), planar ground pattern 32 (FIGS. 2B, 2E, and 2H) of the second coplanar lines, and by way of next conductive vias 41b (FIGS. 2A-2C, 2F, 2H) along the direction of signal transmission. In this way, phase interference of the high-frequency current that is propagated in first ground pattern 30b (FIGS. 2A, 2F, 2G and 2H) does not occur, and as a result, an improvement can be attained in reflection characteristics that deteriorate from low to high frequencies.

This result is obtained if planar ground pattern 30a (FIGS. 2A, 2D, 2E, and 2H) of the first coplanar lines and first ground pattern 30b (FIGS. 2A, 2F, 2G and 2H) of the upper layer of the second coplanar lines are separated, and the separation portion may therefore be of any form. In other words, the opposing sides that form the separation portion between planar ground pattern 30a (FIGS. 2A, 2D, 2E, and 2H) and first ground pattern 30b (FIGS. 2A, 2F, 2G and 2H) need not be formed parallel or at fixed spacing as shown in FIG. 2A.

An additional condition for further improving the reflection characteristic is next described. However, the following explanation presupposes a configuration in which planar ground pattern 30a (FIGS. 2A, 2D, 2E, and 2H) and first ground pattern 30b (FIGS. 2A, 2F, 2G and 2H) are separated by a width of a fixed spacing.

As an additional condition for further improving the reflection characteristics in the present embodiment, the degree of separation between planar ground pattern 30a (FIGS. 2A, 2D, 2E, and 2H) of the first coplanar lines and first ground pattern 30b (FIGS. 2A, 2F, 2G and 2H) of the upper layer of the second coplanar lines is prescribed as follows: i.e., the separation width is prescribed to be greater than 0, and moreover, no greater than interval dx (FIGS. 2A-2C and 2H) from conductive vias 41a (FIGS. 2A-2C, 2E, and 2H) in the vicinity of the connection of first signal line 10 to next conductive via 41b (FIGS. 2A-2C, 2F, 2H) in the direction of the signal transmission.

The reason why this condition achieves a further improvement of the reflection characteristics of the present embodiment is next explained using FIG. 3. FIG. 3 gives a schematic representation of high-frequency current path C (FIG. 3(a)) on the signal transmission side that is propagated through signal lines 10 (FIGS. 2A, 2D, 2E, and 2G) and 11 (FIGS. 2B, 2F, and 2G) and high-frequency current path D (FIG. 3(a)) on the ground pattern side that is propagated through first ground pattern 30b (FIGS. 2A, 2F, 2G and 2H and FIG. (3a)) of the upper layer of the second coplanar lines based on the results of electromagnetic field analysis of the high-frequency transmission line construction of the present embodiment. In addition, (a), (b) and (c) in these figures show states corresponding to FIG. 2A, FIG. 2B, and FIG. 2C; high-frequency current path D (FIG. 3(a)) on the ground pattern side in the figures shows the state of propagation through first ground pattern 30b (FIGS. 2A, 2F, 2G and 2H and FIG. 3(a)) of the upper layer of the second coplanar lines from planar ground pattern 30a (FIGS. 2A, 2D, 2E, and 2H and FIG. 3(a)) of the first coplanar lines by way of conductive vias 41a (FIGS. 2A-2C, 2E, and 2H and FIG. 3(a)). As can be seen from this figure, there is a difference in path length between high-frequency current path C (FIG. 3(a)) on the signal line side that follows opposing signal lines and high-frequency current path D (FIG. 3(a)) on the ground pattern side that follows along the circumferences of ground patterns. Because the distance between the outer circumferences of conductive ground patterns 30a (FIGS. 2A, 2D, 2E, and 2H and FIG. 3(a)) and via 41a (FIGS. 2A-2C, 2E, and 2H and FIG. 3(a)) and/or the distance between the outer circumference of ground pattern 30b (FIGS. 2A, 2F, 2G and 2H and FIG. 3(a)) and conductive via 41b (FIGS. 2A-2C, 2F, 2H and FIG. 3(a)) is decreased to the extent that the above-described separation width is increased, the length of high-frequency current path D (FIG. 3(a)) on the ground pattern side becomes shorter and the difference in path length between high-frequency current path C (FIG. 3(a)) on the signal line side and high-frequency current path D (FIG. 3(a)) on the ground pattern side becomes shorter. As a result, to the extent that the separation width is increased, i.e., to the extent that the difference in the path length between current path C (FIG. 3(a)) and D (FIG. 3(a)) is reduced, the phase difference between high-frequency current path C (FIG. 3(a)) on the signal line side and high-frequency current path D (FIG. 3(a)) on the ground pattern side can be reduced, as can be seen from the above-described Formula (1).

As a result, a further improvement of the reflection characteristics can be achieved by setting the upper limit of the separation width to distance dx (FIGS. 2A-2C and 2H) of conductive vias 41 (FIGS. 2A-2D and 2H and FIG. 3(a)) that can provide maximum separation between ground patterns 30a (FIGS. 2A, 2D, 2E, and 2H and FIGS. 3(a)) and 30b (FIGS. 2A, 2F, 2G and 2H and FIG. 3(a)).

Distance dx (FIGS. 2A-2C and 2H) is prescribed by space of the arrangement of, for example, conductive vias 41a (FIGS. 2A-2C, 2E, and 2H and FIGS. 3(a)) and 41b (FIGS. 2A-2C, 2F, 2H and FIG. 3(a)) that are formed in the second coplanar lines rather than the first coplanar lines. In addition, space of the arrangement of conductive vias 41a (FIGS. 2A-2C, 2E, and 2H and FIGS. 3(a)) and 41b (FIGS. 2A-2C, 2F, 2H and FIG. 3(a)) formed in the second coplanar lines is a value determined for realizing a desired frequency band in the second coplanar lines.

The method of calculating via spacing dx (FIGS. 2A-2C and 2H) is next described.

The inventors of the present invention have found that increase in impedance deviation on planar ground pattern 32 (FIGS. 2B, 2E, and 2H and FIG. 3(b)) that accompanies increase in frequency is suppressed by limiting the sum of the shortest distance from any point of planar ground pattern 32 (FIGS. 2B, 2E, and 2H and FIG. 3(b)) of the second coplanar lines to the nearest conductive via and the layer thickness to a value no greater than a predetermined value, and as a result, have found that the reflection characteristics of the coplanar transmission lines is improved over a broad frequency band. Based on this concept, a formula that includes formula modifications is noted below specifically as a formula for prescribing via spacing dx (FIGS. 2A-2C and 2H).

If R is the shortest distance from any point on the outer circumference of planar ground pattern 32 (FIGS. 2B, 2E, and 2H and FIG. 3(b)) in the second coplanar lines to the nearest via circumference, L3 (FIG. 2B) is the shortest distance from the circumference of conductive via 41b (FIGS. 2A-2C, 2F, 2H and FIG. 3(a)) to the outer circumference of planar ground pattern 32 (FIGS. 2B, 2E, and 2H and FIG. 3(b)) on the second signal line 11 (FIGS. 2B, 2F, and 2G) side, L5 (FIG. 2E) is the thickness of dielectric layer 20a (FIGS. 2A, 2D-2G) between the wiring layers, $\in_2$ is the effective relative dielectric constant of the second coplanar lines, and λ0 is the wavelength of the transmission signal in a vacuum, via distance dx (FIGS. 2A-2C and 2H) is set such that the following formula is satisfied:

[Formula 2]
$$\left(\frac{2\pi}{\lambda 0 / \sqrt{\varepsilon_2}}\right) \times (R + L5) < \frac{\pi}{2}, \text{ or, } R + L5 < \frac{1}{4} \times \frac{\lambda 0}{\sqrt{\varepsilon_2}} \quad (2)$$

Based on FIG. 4(b) in the present embodiment, the longest minimum distance R when the diameter of conductive via 41 is φ is represented by:
[Formula 3]
$$R = \sqrt{(L3 + \phi/2)^2 + (dx/2)^2} - \phi/2 \quad (3)$$

where R+φ/2 (FIG. 4(b)) is the longest minimum distance R plus the radius of conductive via 41.

When the above formula (2) is substituted in formula (3), the formula that via spacing dx (FIGS. 2A-2C and 2H) must satisfy becomes:

[Formula 4]
$$dx < 2 \times \sqrt{\left(\frac{1}{4} \times \frac{\lambda 0}{\sqrt{\varepsilon_2}} + \phi/2 - L5\right)^2 - (L3 + \phi/2)^2} \quad (4)$$

In addition, the above-described separation width can also be prescribed as next described. During signal transmission from the first coplanar lines to the second coplanar lines, conditions are preferable whereby the difference in electrical path lengths (difference in electrical length converted by the effective relative dielectric constant) between the high-frequency current that is propagated in ground patterns and the high-frequency current that is propagated through signal lines does not greatly diverge. Accordingly, the separation width is prescribed to a range by which the phases of high-frequency currents on the ground pattern side and signal line side do not invert at the particular signal wavelength λ0 (the minimum wavelength (maximum frequency) of the desired signal band).

More specifically, as shown in FIG. 2A, L1 (FIG. 2A) is the minimum distance from the circumference of, from among the plurality of conductive vias 41 (FIGS. 2A-2D and 2H) provided in the first coplanar lines, conductive via 41 (FIGS. 2A-2D and 2H) a that interconnects the grounds of the first coplanar lines and second coplanar lines to the outer circumference of planar ground pattern 30a (FIGS. 2A, 2D, 2E, and 2H) on the first signal line 10 (FIGS. 2A, 2D, 2E, and 2G) side (i.e., the minimum distance from the circumference of conductive via 41a (FIGS. 2A-2C, 2E, and 2H) to the outer circumference of planar ground pattern 30a (FIGS. 2A, 2D, 2E, and 2H) that is located on the side of first signal line 10 (FIGS. 2A, 2D, 2E, and 2G)).

L2 (FIG. 2A) is the minimum distance from the circumference of the above-described conductive via 41a (FIGS. 2A-2C, 2E, and 2H) to the outer circumference of planar ground pattern 32 (FIGS. 2B, 2E, and 2H) on the second signal line 11 (FIGS. 2B, 2F, and 2G) side.

L3 (FIG. 2B) is the minimum distance from the circumference of, from among the plurality of conductive vias 41 (FIGS. 2A-2D and 2H) that are provided in the second coplanar lines and excluding conductive vias 41a that interconnect the grounds of the first coplanar lines and the second coplanar lines, conductive via 41b that is closest to conductive via 40 to the outer circumference of planar ground pattern 32 on the second signal line 11 side.

L4 (FIG. 2A) is the minimum distance from the circumference of the above-described conductive via 41b (FIGS. 2A-2C, 2F, 2H) to the outer circumference of first ground pattern 30b (FIGS. 2A, 2F, 2G and 2H) of the first coplanar lines.

L5 (FIG. 2E) is the dielectric layer thickness between first ground pattern 30b (FIGS. 2A, 2F, 2G and 2H) and planar ground pattern 32 (FIGS. 2B, 2E, and 2H).

L6 (in FIG. 2A) is the minimum distance from the circumference of conductive via 40 (FIGS. 2A, 2B, 2E, and 2G) that interconnects signal lines 10 (FIGS. 2A, 2D, 2E, and 2G) and 11 (FIGS. 2B, 2F, and 2G) to the outer circumference of first signal line 10 (FIGS. 2A, 2D, 2E, and 2G).

L7 (FIG. 7B) is the minimum distance from the circumference of the above-described conductive via 40 (FIGS. 2A, 2B, 2E, and 2G) to the outer circumference of second signal line 11 (FIGS. 2B, 2F, and 2G).

L10 (FIG. 2A) is the minimum distance from the circumference of conductive via 41a (FIGS. 2A-2C, 2E, and 2H) to the outer circumference of planar ground pattern 30a (FIGS. 2A, 2D, 2E, and 2H) on the first ground pattern 30b (FIGS. 2A, 2F, 2G and 2H) side.

When dimensions are set as described above, the range, in which the phase of each of the high-frequency currents that passes by the two current paths C (FIG. 3A) and D (FIG. 3A) shown in FIG. 3, does not invert at a particular signal wavelength λ0 (the minimum wavelength (maximum frequency) of the desired signal band), can be prescribed by:

[Formula 5]
$$\begin{bmatrix} \sqrt{\varepsilon_1} \times \left\{2 \times \left(\frac{\phi}{2} + L10\right) + L1\right\} + \sqrt{\varepsilon_2} \times \\ \left\{2 \times L5 + L2 + 2 \times L3 + dx + 2 \times \left(L4 + \frac{\phi}{2}\right)\right\} \end{bmatrix} - \\ \begin{bmatrix} \sqrt{\varepsilon_1} \times L6 + \\ \sqrt{\varepsilon_2} \times (L5 + L7 + dx) \end{bmatrix} < \frac{\lambda_0}{2}$$

or in other words, can be prescribed by:

[Formula 5A]
$$\sqrt{\varepsilon_1} \times \{(L1 - L6) + \phi + L10 \times 2\} + \\ \sqrt{\varepsilon_2} \times \{(L2 - L7) + L3 \times 2 + L4 \times 2 + \phi + L5\} < \frac{\lambda_0}{2} \quad (5A)$$

Here, $\in_1$ represents the effective relative dielectric constant of the first coplanar lines, $\in_2$ represents the effective relative dielectric constant of the second coplanar lines, and φ represents the diameter of conductive vias 41 (FIGS. 2A-2D and 2H).

As a result, in the present embodiment, planar ground pattern 30a (FIGS. 2A, 2D, 2E, and 2H and FIG. 3(a)) of the first coplanar lines and first ground pattern 30b (FIGS. 2A, 2F, 2G and 2H and FIG. 3(a)) of the second coplanar lines that are provided on the same layer are preferably separated such that this formula (5) is satisfied.

The reflection characteristics realized by this embodiment are next described.

The following numerical conditions were adopted when inspecting the reflection characteristics. A three-layer wiring board composed of LTCC (low-temperature co-fired ceramic) board having a dielectric constant of 7.1 was used for dielectric wiring board 20 (FIGS. 2D-2F).

First and second dielectric layers 20a (FIGS. 2A, 2D-2G) and 20b (FIGS. 2B, 2D-2G) of this dielectric wiring board 20 (FIGS. 2D-2F) are of the same material, the dielectric layer thickness L5 (FIG. 2E) of each being 250 μm and the conductive thickness being 15 μm. In addition, the signal width of first signal line 10 (FIGS. 2A, 2D, 2E, and 2G) was 150 μm, the gap spacing between first signal line 10 (FIGS. 2A, 2D, 2E, and 2G) and planar ground pattern 30a (FIGS. 2A, 2D, 2E, and 2H) was 66 μm, the signal line width of second signal line 11 (FIGS. 2B, 2F, and 2G) was 100 μm, the gap spacing between second signal line 11 (FIGS. 2B, 2F, and 2G) and planar ground pattern 32 (FIGS. 2B, 2E, and 2H) was 120 μm, the diameter of conductive via 40 (FIGS. 2A, 2B, 2E, and 2G) was 100 μm, the diameter φ of conductive vias 41 (FIGS. 2A-2D and 2H) was 150 μm, and the all via spacing along the direction of signal transmission of the plurality of conductive vias 41 (FIGS. 2A-2D and 2H) was 500 μm. In addition, the minimum distance L1 (FIG. 2A) from the circumference of conductive via 41a (FIGS. 2A-2C, 2E, and 2H) to the outer circumference of planar ground pattern 30a (FIGS. 2A, 2D, 2E, and 2H) on the first signal line 10 (FIGS. 2A, 2D, 2E, and 2G) side was 135 μm. The minimum distance L2 (FIG. 2B) from the circumference of conductive via 41a (FIGS. 2A-2C, 2E, and 2H) to the outer circumference of planar ground pattern 32 (FIGS. 2B, 2E, and 2H) on the second signal line 11 (FIGS. 2B, 2F, and 2G) side was 106 μm. The minimum distance L3 (FIG. 2B) from the circumference of conductive via 41b (FIGS. 2A-2C, 2F, 2H) to the outer circumference of planar ground pattern 32 (FIGS. 2B, 2E, and 2H) on the second signal line 11 (FIGS. 2B, 2F, and 2G) side was 106 μm.

Relating to the configuration realized by these numerical conditions, a case is considered in which planar ground pattern 30a (FIGS. 2A, 2D, 2E, and 2H) of the first coplanar lines and first ground pattern 30b (FIGS. 2A, 2F, 2G and 2H) of the second coplanar lines that is provided on the same layer as planar ground pattern 30a (FIGS. 2A, 2D, 2E, and 2H) are separated by a slit-shaped separation width of 300 μm midway between conductive vias 41a (FIGS. 2A-2C, 2E, and 2H) and conductive vias 41b (FIGS. 2A-2C, 2F, 2H).

In this case, minimum distance L4 (FIG. 2A) from the circumference of conductive via 41b (FIGS. 2A-2C, 2F, 2H) to the outer circumference of first ground pattern 30b (FIGS. 2A, 2F, 2G and 2H) on the first coplanar line side is 25 μm, minimum distance L6 (FIG. 2A) from the circumference of conductive via 40 (FIGS. 2A, 2B, 2E, and 2G) to the outer circumference of first signal line 10 (FIGS. 2A, 2D, 2E, and 2G) is 25 μm, minimum distance L7 (FIG. 2B) from the circumference of conductive via 40 (FIGS. 2A, 2B, 2E, and 2G) to the outer circumference of second signal line 11 (FIGS. 2B, 2F, and 2G) is 0 μm, and minimum distance L10 (FIGS. 2A, 2D, 2E, and 2G) from the circumference of conductive via 41a (FIGS. 2A-2C, 2E, and 2H) to planar ground pattern 30a FIGS. 2A, 2D, 2E, and 2H) on the first ground pattern 30b (FIGS. 2A, 2F, 2G and 2H) side is 25 μm. In addition, the effective relative dielectric constant $\in_1$ of the first coplanar lines is 3.723, and the effective relative dielectric constant $\in_2$ of the second coplanar lines is 7.1.

When the above-described numerical conditions are inserted in the aforementioned formula (5), the left side is:

$$\sqrt{3.723} \times \{(135-25)+150+25\times 2\} + \\ \sqrt{7.1} \times \{(106-0)+135\times 2+25\times 2+150+250\} = 2645 \\ \mu m$$

As a result, first ground pattern 30b (FIGS. 2A, 2F, 2G and 2H) and planar ground pattern 30a (FIGS. 2A, 2D, 2E, and 2H) on the first wiring layer are separated such that 2645 μm<λ0/2 is satisfied in the present embodiment.

The frequency can be derived by means of the following formula (6).

$$c = f \cdot \lambda 0, \text{ or } f = c/\lambda 0 \tag{6}$$

where c is the speed of light, or $3.0 \times 10^8$ m/s, and f is the frequency.

Considering a case in which the left side and right side are equal in the relational expression 2645 μm<λ0/2, if λ0=2×2645×10⁻⁶, then f=57×10⁹ Hz=57 GHz is calculated from the above formula (6).

In other words, in the case of a separation width of 300 μm, the frequency range that satisfies 2645 μm<λ0/2 is lower than 57 GHz, and up to the level of 57 GHz, a separation width is set that enables an improvement of the reflection characteristics.

Figure 5:
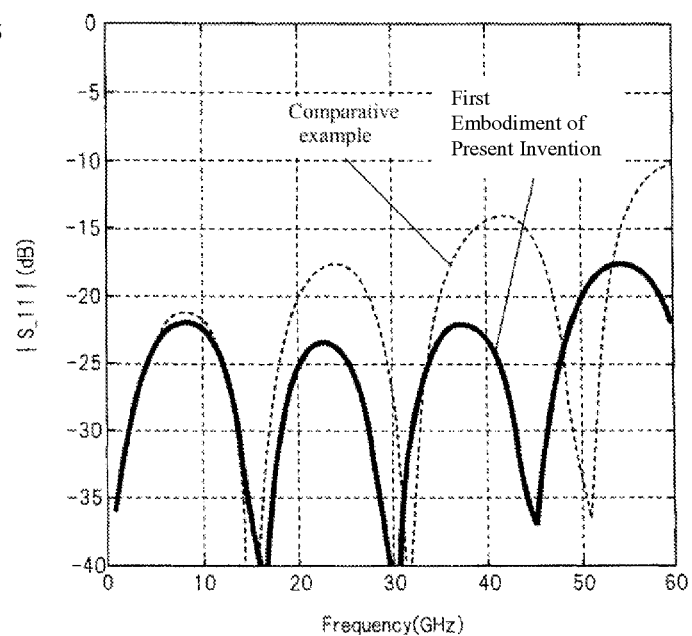
FIG. 5 shows the results of electromagnetic field analysis in which a comparison of the input reflection characteristics of a comparative example and the first embodiment was performed.

In addition, a comparative example in which planar ground pattern 30a of the first coplanar lines and first ground pattern 30b of the second coplanar lines are not separated and the present embodiment in which these ground patterns 30a (FIGS. 2A, 2D, 2E, and 2H) and 30b (FIGS. 2A, 2F, 2G and 2H) are separated by a 300 μm slit-shaped separation width midway between conductive vias 41a (FIGS. 2A-2C, 2E, and 2H) and 41b (FIGS. 2A-2C, 2F, 2H) were constructed by the above-described numerical conditions and a comparison of input reflection characteristics was then carried out. FIG. 5 shows the results of the electromagnetic field analysis. FIG. 5 plots the S parameter |S_11|, measured in decibels (dB), which represents the degree of reflection of the signal, against frequency of the signal, measured in gigahertz (GHz). FIG. 5 shows the plot for the Comparative example (in which planar ground pattern 30a of the first coplanar lines and first ground pattern 30b of the second coplanar lines are not separated) and the plot for the First Embodiment of Present Invention (with the ground patterns 30a (FIGS. 2A, 2D, 2E, and 2H) and 30b (FIGS. 2A, 2F, 2G and 2H) separated by a 300 μm slit-shaped separation width midway between conductive vias 41a (FIGS. 2A-2C, 2E, and 2H) and 41b (FIGS. 2A-2C, 2F, 2H)). As can be seen from the figure, an improvement of reflection characteristics was obtained by means of the present embodiment over a broad band from a low frequency to the vicinity of 60 GHz.

When the values φ=150 μm, L3=106 μm, L5=250 μm, $\in_2$=7.1, and λ0 =5450 μm are substituted in the above-described formula (4), the spacing dx of the plurality of conductive vias 41 (FIGS. 2A-2D and 2H) that are formed on the second coplanar lines must satisfy the range dx<568 μm. However, dx=500 μm in the analysis of the embodiment because 500 μm is a reasonable design value for the via spacing dx along the direction of signal transmission of the plurality of conductive vias 41 (FIGS. 2A-2D and 2H).

Figure 6:
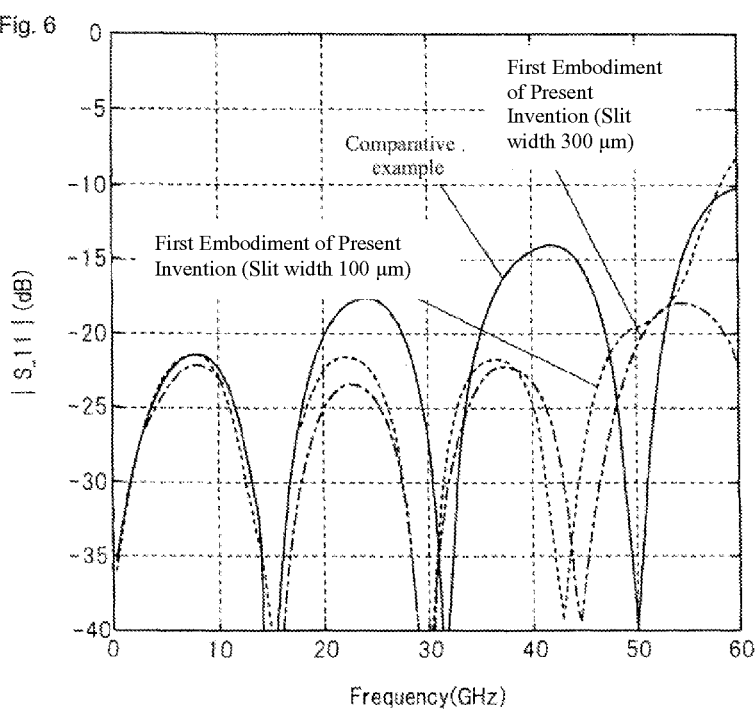
FIG. 6 shows the results of electromagnetic field analysis in which comparison of the input reflection characteristics in the first embodiment was carried out while changing the separation width.

FIG. 6 further shows the results of electromagnetic field analysis when the above-described separation width (between the ground patterns 30a (FIGS. 2A, 2D, 2E, and 2H) and 30b (FIGS. 2A, 2F, 2G and 2H)) is varied. In particular, FIG. 6 plots the S parameter |S_11|, measured in decibels (dB), which represents the degree of reflection of the signal, against frequency of the signal, measured in gigahertz (GHz).

FIG. 6 shows the plot for the Comparative example (in which planar ground pattern 30a of the first coplanar lines and first ground pattern 30b of the second coplanar lines are not separated), the plot for the First Embodiment of Present Invention (with the ground patterns 30a (FIGS. 2A, 2D, 2E, and 2H) and 30b (FIGS. 2A, 2F, 2G and 2H) separated by a 300 μm slit-shaped separation width, and the plot for the First Embodiment of Present Invention (with the ground patterns 30a (FIGS. 2A, 2D, 2E, and 2H) and 30b (FIGS. 2A, 2F, 2G and 2H) separated by a 100 μm slit-shaped separation width). As can be seen from this figure, as the separation width increases, improvement of the reflection characteristics is exhibited over a broader band. In other words, the S parameter |S_11|(dB), that represents the degree of reflection, is reduced to a lower degree from a low-frequency region to the vicinity of 55 GHz in a case (First Embodiment of Present Invention) in which the slit width is 100 μm than in the comparative example (in which planar ground pattern 30a of the first coplanar lines and first ground pattern 30b of the second coplanar lines are not separated), and is reduced to a lower degree from a low-frequency region to the vicinity of 60 GHz in a case (First Embodiment of Present Invention) in which the slit width is 300 μm than in the comparative example (in which planar ground pattern 30a of the first coplanar lines and first ground pattern 30b of the second coplanar lines are not separated).

The technical idea of the first embodiment described hereinabove can also be reflected in the following embodiments.

Second Embodiment

Figure 7A:
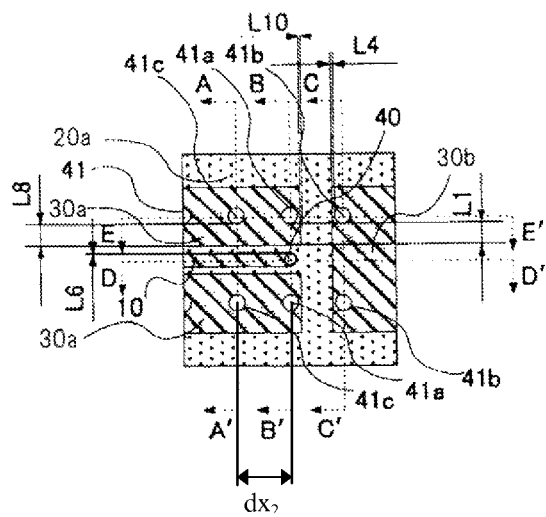
FIG. 7A is a plan view showing the first wiring layer of the high-frequency wiring board of the second embodiment.
Figure 7B:
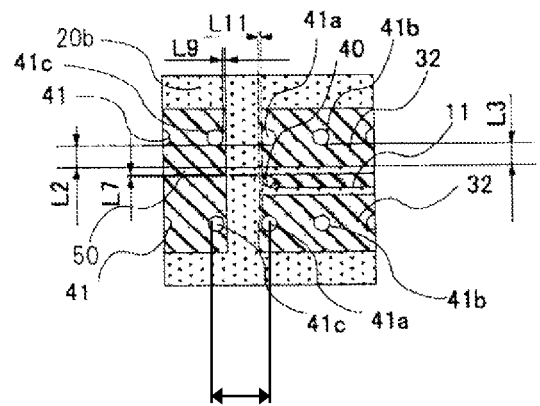
FIG. 7B is a plan view showing the second wiring layer of the high-frequency wiring board of the second embodiment.
Figure 7C:
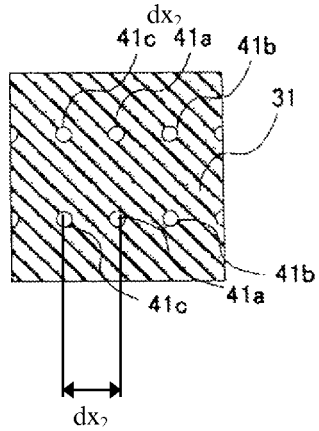
FIG. 7C is a plan view showing the third wiring layer of the high-frequency wiring board of the second embodiment.
Figure 7D:
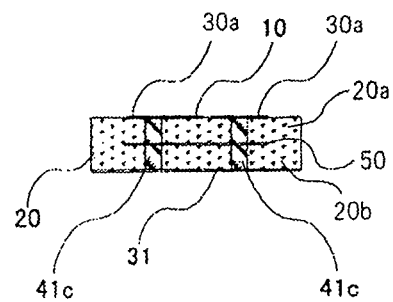
FIG. 7D is a sectional view of the high-frequency wiring board taken along line A-A' of FIG. 7A.
Figure 7E:
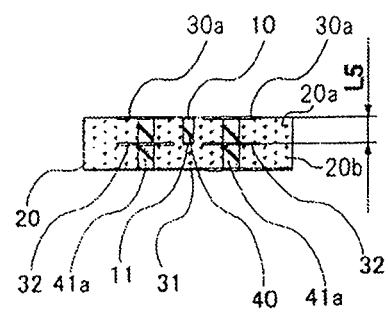
FIG. 7E is a sectional view of the high-frequency wiring board taken along line B-B' of FIG. 7A.
Figure 7F:
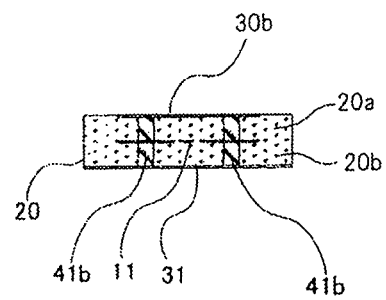
FIG. 7F is a sectional view of the high-frequency wiring board taken along line C-C' of FIG. 7A.
Figure 7G:
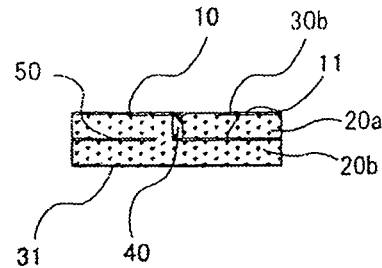
FIG. 7G is a sectional view of the high-frequency wiring board taken along line D-D' of FIG. 7A.
Figure 7H:
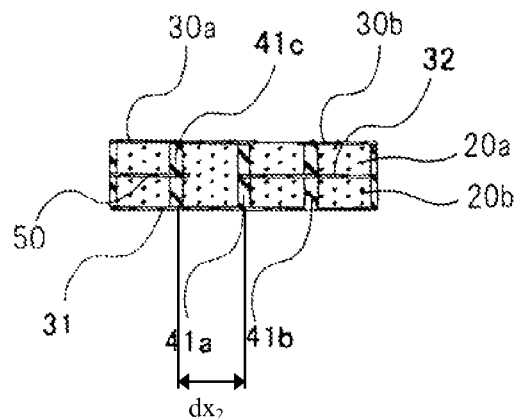
FIG. 7H is a sectional view of the high-frequency wiring board taken along line E-E' of FIG. 7A.

FIGS. 7A-7H show the configuration of a high-frequency wiring board according to the second embodiment of the present invention. To state in greater detail, FIG. 7A is a plan view showing first wiring layer of the high-frequency wiring board of the present embodiment, FIG. 7B is a plan view of the second wiring layer of the high-frequency wiring board, and FIG. 7C is a plan view of the third wiring layer of the high-frequency wiring board. FIG. 7D is a sectional view of the board taken along line A-A' of FIG. 7A, FIG. 7E is a sectional view of the board taken along line B-B' of FIG. 7A, FIG. 7F is a sectional view of the board taken along line C-C' of FIG. 7A, FIG. 7G is a sectional view of the board taken along line D-D' of FIG. 7A, and FIG. 7H is a sectional view of the board taken along line E-E' of FIG. 7A. In each of the figures, the same reference numerals are used for functional parts that are the same as constituent elements shown in FIGS. 1A-1D.

The high-frequency wiring board of the present embodiment is made up of dielectric wiring board 20 realized by stacking two dielectric layers 20a (FIGS. 7A, 7D-7G, and 7H) and 20b (FIGS. 7B and 7D-7H). First coplanar lines are formed on the upper surface of first dielectric layer 20a (FIGS. 7A, 7D-7G, and 7H), which is the obverse side of dielectric wiring board 20 (FIGS. 7D-7F) (first wiring layer) (FIG. 7A). These first coplanar lines are made up from first signal line 10 and planar ground pattern 30a formed on both sides of first signal line 10 (FIGS. 7A, 7D, 7E, 7G) and on the same layer as first signal line 10 (FIGS. 7A, 7D, 7E, 7G). In addition, second coplanar lines are formed on the upper surface of second dielectric layer 20b (FIGS. 7B and 7D-7H), which is an internal layer (second wiring layer) (FIG. 7B) of dielectric wiring board 20 (FIGS. 7D-7F). The second coplanar lines are made up from second signal line 11 (FIGS. 7B, 7E-7G) and planar ground pattern 32 (FIGS. 7B, 7E, and 7H) that is formed on both sides of second signal line 11 (FIGS. 7B, 7E-7G)and on the same layer as second signal line 11 (FIGS. 7B, 7E-7G). In addition, planar ground patterns 30a (FIGS. 7A, 7D, 7E, and 7H) and 32 (FIGS. 7B, 7E, and 7H) of the first and second coplanar lines may also be formed on only one of the two positions that sandwich each of the signal lines.

First signal line 10 (FIGS. 7A, 7D, 7E, 7G)of the first coplanar lines and second signal line 11 (FIGS. 7B, 7E-7G) of the second coplanar lines that is on a different wiring layer than first signal line 10 (FIGS. 7A, 7D, 7E, 7G) are connected by conductive via 40 (FIGS. 7A, 7B, 7E, and 7G) at the line end of each signal line.

Planar first ground pattern 30b (FIGS. 7A, 7D, and 7E) and a planar second ground pattern 31 (FIGS. 7C-7H) are respectively formed on the first wiring layer and third wiring layer (the reverse surface of dielectric wiring board 20 (FIGS. 7D-7F)) such that the layer on which second signal line 11 (FIGS. 7B, 7E-7G) is formed is interposed from above and below. This second ground pattern 31 (FIGS. 7C-7H) also extends into areas that confront the first coplanar lines and thus doubles as a lower-layer ground of the first coplanar lines.

On the other hand, first ground pattern 30b (FIGS. 7A, 7D, and 7E) does not double as the ground pattern of the first coplanar lines as in the background art and is separated from ground pattern 30a (FIGS. 7A, 7D, 7E, and 7H). More specifically, planar ground pattern 30a (FIGS. 7A, 7D, 7E, and 7H) of the first coplanar lines and first ground pattern 30b (FIGS. 7A, 7D, and 7E) of the upper layer of the second coplanar lines are separated by way of a predetermined width (dielectric width) in the direction of the extension of the second coplanar lines from the vicinity of the connection of first signal line 10 (FIGS. 7A, 7D, 7E, 7G) and conductive via 40 (FIGS. 7A, 7B, 7E, and 7G).

In addition, planar ground pattern 30a (FIGS. 7A, 7D, 7E, and 7H) of the first coplanar lines and second ground pattern 31 (FIGS. 7C-7H) that doubles as the lower-layer ground of the first coplanar lines are interconnected by a plurality of conductive vias 41 (FIGS. 7A and 7B) arranged at a predetermined spacing along the direction of signal transmission of the first coplanar lines. Of the plurality of conductive vias 41 (FIGS. 7A and 7B), conductive vias 41a (FIGS. 7A-7C, 7E, and 7H) in the vicinities of the connection of first signal line 10 (FIGS. 7A, 7D, 7E, 7G) and second signal line 11 (FIGS. 7B, 7E-7G) also interconnect planar ground pattern 30a (FIGS. 7A, 7D, 7E, and 7H) of the first coplanar lines and planar ground pattern 32 (FIGS. 7B, 7E, and 7H) of the second coplanar lines.

In addition, first ground pattern 30b (FIGS. 7A, 7D, and 7E) that is on the upper layer of second coplanar lines and planar ground pattern 32 (FIGS. 7B, 7E, and 7H) of the second coplanar lines and second ground pattern 31 (FIGS. 7C-7H) are interconnected by the plurality of conductive vias 41 (FIGS. 7A and 7B) (41b) (FIGS. 7A-7C, 7F, 7H) that are arranged at a predetermined spacing along the direction of signal transmission of the second coplanar lines.

The configuration described above is the same as the first embodiment, but the present embodiment adds the following modifications to the first embodiment. Specifically, ground pattern 50 (FIGS. 7B, 7D, and 7H) is provided in the area that confronts the first coplanar lines that are provided with planar ground pattern 30a (FIGS. 7A, 7D, 7E, and 7H) and first signal line 10 (FIGS. 7A, 7D, 7E, 7G), and moreover, that is provided on the same layer as planar ground pattern 32 (FIGS. 7B, 7E, and 7H) of the second coplanar lines. This ground pattern 50 (FIGS. 7B, 7D, and 7H) is electrically connected to both planar ground pattern 30a (FIGS. 7A, 7D, 7E, and 7H) of the first coplanar lines and second ground pattern 31 (FIGS. 7C-7H) by a plurality of conductive vias 41

(FIGS. 7A and 7B) that are arranged at a predetermined spacing along the direction of signal transmission.

This ground pattern 50 (FIGS. 7B, 7D, and 7H) is separated from ground pattern 32 (FIGS. 7B, 7E, and 7H) without doubling as a planar ground pattern of the second coplanar lines as in the background art. More specifically, planar ground pattern 32 (FIGS. 7B, 7E, and 7H) of the second coplanar lines and ground pattern 50 (FIGS. 7B, 7D, and 7H) of the lower layer of the first coplanar lines are separated by a predetermined width (dielectric width) in the direction of the extension of the first coplanar lines from the vicinity of the connection of second signal line 11 (FIGS. 7B, 7E-7G) and conductive via 40 (FIGS. 7A, 7B, 7E, and 7G).

In the high-frequency transmission lines of this type of high-frequency wiring board, planar ground pattern 30a (FIGS. 7A, 7D, 7E, and 7H) of the first coplanar lines and first ground pattern 30b of the upper layer of the second coplanar lines are separated in the direction of the extension of the second coplanar lines from the vicinity of the connection of first signal line 10 (FIGS. 7A, 7D, 7E, 7G) and conductive via 40 (FIGS. 7A, 7B, 7E, and 7G). As a result, during transmission of a signal from the first coplanar lines to the second coplanar lines, the high frequency paths of the high-frequency current that is propagated in first ground pattern 30b (FIGS. 7A, 7D, and 7E) of the upper layer of the second coplanar lines are restricted to one path. In other words, the high-frequency current path that is propagated in ground pattern 30b (FIGS. 7A, 7D, and 7E) at the time of signal transmission to the second coplanar lines is only the path from planar ground pattern 30a (FIGS. 7A, 7D, 7E, and 7H) of the first coplanar lines that passes successively by way of conductive via 41a (FIGS. 7A-7C, 7E, and 7H), planar ground pattern 32 (FIGS. 7B, 7E, and 7H) of the second coplanar lines, and by way of the next conductive via 41b (FIGS. 7A-7C, 7F, 7H) along the direction of signal transmission toward first ground pattern 30b (FIGS. 7A, 7D, and 7E). In this way, phase 5 interference of the high-frequency current that is propagated in first ground pattern 30b (FIGS. 7A, 7D, and 7E) does not occur. As a result, reflection characteristics that progressively deteriorate from low frequencies to high frequencies can be improved. In the present embodiment, moreover, planar ground pattern 32 (FIGS. 7B, 7E, and 7H) of the second coplanar lines and ground pattern 50 (FIGS. 7B, 7D, and 7H) of the lower layer of the first coplanar lines are separated by way of a predetermined width (dielectric width) in the direction of the extension of the first coplanar lines from the vicinity of the connection of second signal line 11 (FIGS. 7B, 7E-7G) and conductive via 40 (FIGS. 7A, 7B, 7E, and 7G). As a result, even should a signal be transmitted from the second coplanar lines to the first coplanar lines, the high-frequency paths of the high-frequency current that is propagated in first ground pattern 30b (FIGS. 7A, 7D, and 7E) of the upper layer of the second coplanar lines are restricted to one path. In other words, the only high-frequency current path that is propagated in ground pattern 50 (FIGS. 7B, 7D, and 7H) during transmission of a signal to the first coplanar lines is the path toward ground pattern 50 (FIGS. 7B, 7D, and 7H) that passes successively from planar ground pattern 32 (FIGS. 7B, 7E, and 7H) of the second coplanar lines to conductive via 41a (FIGS. 7A-7C, 7E, and 7H), to planar ground pattern 30a (FIGS. 7A, 7D, 7E, and 7H) of the first coplanar lines, and to the next conductive via 41c (FIGS. 7A-7D and 7H) along the direction of signal transmission. In this way, phase interference of the high-frequency current that is propagated in ground pattern 50 (FIGS. 7B, 7D, and 7H) does not occur. As a result, reflection characteristics that progressively deteriorate from low frequencies to high frequencies can be improved.

Essentially, according to the present embodiment, superior reflection characteristics can be maintained even when the direction of signal transmission between the first coplanar lines and second coplanar lines is altered according to the state of application of the high-frequency wiring board.

This type of effect is obtained if planar ground pattern 30a (FIGS. 7A, 7D, 7E, and 7H) of the first coplanar lines and first ground pattern 30b (FIGS. 7A, 7D, and 7E) of the upper layer of the second coplanar lines are separated and if planar ground pattern 32 (FIGS. 7B, 7E, and 7H) of the second coplanar lines and ground pattern 50 (FIGS. 7B, 7D, and 7H) of the lower layer of the first coplanar lines are separated, and these separation portions may take any form. The confronting sides that form the separation portions between planar ground pattern 30a (FIGS. 7A, 7D, 7E, and 7H) and first ground pattern 30b (FIGS. 7A, 7D, and 7E) and between planar ground pattern 32 (FIGS. 7B, 7E, and 7H) and ground pattern 50 (FIGS. 7B, 7D, and 7H) need not be formed at a fixed spacing or in parallel as shown in the FIGS. 7A and 7B.

Additional conditions for further improving the reflection characteristics are next described. However, the following explanation presupposes a configuration in which planar ground pattern 30a (FIGS. 7A, 7D, 7E, and 7H) and first ground pattern 30b (FIGS. 7A, 7D, and 7E) as well as planar ground pattern 32 (FIGS. 7B, 7E, and 7H) and ground pattern 50 (FIGS. 7B, 7D, and 7H) are separated by the width of a fixed spacing.

As additional conditions for improving reflection characteristics in the present embodiment, a first separation width between planar ground pattern 30a (FIGS. 7A, 7D, 7E, and 7H) and first ground pattern 30b (FIGS. 7A, 7D, and 7E) as well as a second separation width between planar ground pattern 32 (FIGS. 7B, 7E, and 7H) and ground pattern 50 (FIGS. 7B, 7D, and 7H) are prescribed as described below.

The upper limit of the above-described first separation width is prescribed by the spacing of conductive vias 41 (FIGS. 7A and 7B) formed on the second coplanar lines (space of the arrangement of conductive vias 41a (FIGS. 7A-7C, 7E, and 7H) and 41b (FIGS. 7A-7C, 7F, 7H)), and the reason for this limit and a method for calculating the via spacing are as described in the first embodiment.

Regarding the above-described second separation width, the same thinking as in the method of prescribing the first separation width is adopted, the second separation width being prescribed by the spacing of conductive vias 41 (FIGS. 7A and 7B) formed on first coplanar lines (space of the arrangement of conductive vias 41a (FIGS. 7A-7C, 7E, and 7H) and 41c (FIGS. 7A-7D and 7H)). In other words, the second separation width is prescribed to be greater than 0, and moreover, to be no greater than the spacing from conductive via 41a (FIGS. 7A-7C, 7E, and 7H) in the vicinity of connection end of second signal line 11 (FIGS. 7B, 7E-7G) to the next conductive via 41c (FIGS. 7A-7D and 7H) in the direction of signal transmission. In addition, space of the arrangement of, for example, conductive vias 41a (FIGS. 7A-7C, 7E, and 7H) and 41c (FIGS. 7A-7D and 7H) that are formed in the first coplanar lines is a value determined for realizing the desired frequency band in the first coplanar lines. Although this value is not explained in detail, the value can be found using the same calculation method and concepts as explained in the first embodiment.

As in the first embodiment, the above-described first and second separation widths can also be prescribed as shown below. Specifically, during signal transmission from a particular coplanar line to another coplanar line, conditions are preferable whereby the difference in the electrical path lengths (difference in electrical lengths calculated by the effective relative dielectric constant) of the high-frequency current that is propagated through ground patterns and the high-frequency current that is propagated through signal lines do not greatly diverge, and the first and second separation widths are therefore prescribed within ranges in which the phases of the high-frequency currents on the ground pattern side and signal line side do not invert at a particular signal wavelength λ0 (the minimum wavelength (maximum frequency) of the desired signal band). Because the method of prescribing the first separation width according to this concept was explained in the first embodiment, only the method of prescribing second separation width is described here.

First, L1 (FIG. 7A) is the minimum distance from, among the plurality of conductive vias 41 (FIGS. 7A and 7B) provided in the coplanar lines as shown in FIG. 7A, the circumference of conductive via 41a (FIGS. 7A-7C, 7E, and 7H) that interconnects the grounds of the first coplanar lines and the second coplanar lines to the outer circumference of planar ground pattern 30a (FIGS. 7A, 7D, 7E, and 7H) on the first signal line 10 (FIGS. 7A, 7D, 7E, 7G) side.

L2 (FIG. 7B) is the minimum distance from the circumference of the above-described conductive via 41a (FIGS. 7A-7C, 7E, and 7H) to the outer circumference of planar ground pattern 32 (FIGS. 7B, 7E, and 7H) on the second signal line 11 (FIGS. 7B, 7E-7G) side.

L5 (FIG. 7E) is the dielectric layer thickness between first ground pattern 30b (FIGS. 7A, 7D, and 7E) and planar ground pattern 32 (FIGS. 7B, 7E, and 7H).

L6 (FIG. 7A) is the minimum distance from the circumference of conductive via 40 (FIGS. 7A, 7B, 7E, and 7G) that interconnects signal line 10 (FIGS. 7A, 7D, 7E, 7G) and 11 (FIGS. 7B, 7E-7G) to the outer circumference of first signal line 10 (FIGS. 7A, 7D, 7E, 7G).

L7 (FIG. 7B) is the minimum distance from the circumference of the above-described conductive via 40 (FIGS. 7A, 7B, 7E, and 7G) to the outer circumference of second signal line 11 (FIGS. 7B, 7E-7G).

L8 (FIG. 7A) is the minimum distance from, among the plurality of conductive vias 41 (FIGS. 7A and 7B) provided in the first coplanar lines, excluding conductive vias 41a (FIGS. 7A-7C, 7E, and 7H) that interconnect the grounds of first coplanar lines and second coplanar lines, the circumference of conductive via 41c (FIGS. 7A-7D and 7H) that is closest to conductive via 40 (FIGS. 7A, 7B, 7E, and 7G) to the outer circumference of planar ground pattern 30a (FIGS. 7A, 7D, 7E, and 7H) on the first signal line 10 (FIGS. 7A, 7D, 7E, 7G) side.

L9 (FIG. 7B) is the minimum distance from the circumference of the above-described conductive via 41c (FIGS. 7A-7D and 7H) to the outer circumference of ground pattern 50 (FIGS. 7B, 7D, and 7H) on the second coplanar line side.

L10 (FIG. 7A) is the minimum distance from the circumference of the above-described conductive via 41a (FIGS. 7A-7C, 7E, and 7H) to the outer circumference of planar ground pattern 30a (FIGS. 7A, 7D, 7E, and 7H) on the first ground pattern 30b (FIGS. 7A, 7D, and 7E) side.

L11 (FIG. 7B) is the minimum distance from the circumference of the above-described conductive via 41a (FIGS. 7A-7C, 7E, and 7H) to the outer circumference of planar ground pattern 32 (FIGS. 7B, 7E, and 7H) on the ground pattern 50 (FIGS. 7B, 7D, and 7H) side.

Finally, $dx_2$ (FIGS. 7A-7C and 7H) is the spacing of conductive vias 41a (FIGS. 7A-7C, 7E, and 7H) and 41c (FIGS. 7A-7D and 7H).

When the above-described dimensions are set, the range in which inversion does not occur in the phases of each of the high-frequency currents that pass by the high-frequency current path on the signal line side that is propagated through signal lines 10 and 11 (FIGS. 7B, 7E-7G) and the high-frequency current path on the ground pattern side that is propagated from planar ground pattern 32 (FIGS. 7B, 7E, and 7H) of the second coplanar lines and through ground pattern 50 (FIGS. 7B, 7D, and 7H) of the lower layer of the first coplanar lines by way of conductive via 41a (FIGS. 7A-7C, 7E, and 7H) at a particular signal wavelength λ0 (the minimum wavelength (maximum frequency) of the desired signal band) can be prescribed by the formula:

$$\left[ \begin{array}{l} \sqrt{\varepsilon_1} \times \{L1 + dx + 2 \times L8 + L5 + 2 \times (\frac{\phi}{2} + L9)\} + \\ \sqrt{\varepsilon_2} \times \{2 \times (L11 + \frac{\phi}{2}) + L2 + L5\} \end{array} \right] - \qquad \text{[Formula 7]}$$

$$\left[ \begin{array}{l} \sqrt{\varepsilon_1} \times (L6 + dx) + \\ \sqrt{\varepsilon_2} \times (L5 + L7) \end{array} \right] < \frac{\lambda_0}{2}$$

this formula being equivalent to:

$$\sqrt{\varepsilon_1} \times \{(L1 - L6) + 2 \times L8 + L5 + \phi + 2 \times L9\} + \qquad \text{[Formula 8]}$$
$$\sqrt{\varepsilon_2} \times \{(L2 - L7) + 2 \times L11 + \phi\} < \frac{\lambda_0}{2}$$

As a result, in the present embodiment, planar ground pattern 32 (FIGS. 7B, 7E, and 7H) of the second coplanar lines and ground pattern 50 (FIGS. 7B, 7D, and 7H) of the lower layer of the first coplanar lines are preferably separated such that this formula (7) is satisfied.

Explanation next regards the reflection characteristics realized by the present embodiment.

In the inspection of the reflection characteristics, the same numerical conditions were adopted as in the first embodiment, with the exception of the following points of change. Specifically, because ground pattern 50 (FIGS. 7B, 7D, and 7H) of the lower layer of the first coplanar lines is provided in the present embodiment, the gap spacing of first signal line 10 (FIGS. 7A, 7D, 7E, 7G) and planar ground pattern 30a (FIGS. 7A, 7D, 7E, and 7H) was changed to 78 μm. In addition, minimum distance L8 from the circumference of conductive via 41c (FIGS. 7A-7D and 7H) to the outer circumference of planar ground pattern 30a (FIGS. 7A, 7D, 7E, and 7H) on the first signal line 10 (FIGS. 7A, 7D, 7E, 7G) side is the same as distance L1 (FIGS. 7A) at 135 μm.

In addition to the configuration realized by these numerical conditions, planar ground pattern 30a (FIGS. 7A, 7D, 7E, and 7H) of the first coplanar lines and first ground pattern 30b (FIGS. 7A, 7D, and 7E) of the second coplanar lines that are provided on the same layer as planar ground pattern 30a (FIGS. 7A, 7D, 7E, and 7H) are separated by a slit-shaped separation width of 300 μm midway between conductive vias 41a (FIGS. 7A-7C, 7E, and 7H) and conductive vias 41b (FIGS. 7A-7C, 7F, 7H). Further, planar ground pattern 32 (FIGS. 7B, 7E, and 7H) of the second coplanar lines and ground pattern 50 (FIGS. 7B, 7D, and 7H) of the lower layer of the first coplanar lines are separated by a slit-shaped separation width of 300 μm midway between conductive vias 41a (FIGS. 7A-7C, 7E, and 7H) and conductive vias 41c (FIGS. 7A-7D and 7H).

In this case, minimum distance L4 from the circumference of conductive via 41b (FIGS. 7A-7C, 7F, 7H) to the outer circumference of first ground pattern 30b (FIGS. 7A, 7D, and 7E) on the first coplanar line side is 25 μm, minimum distance L6 (FIG. 7A) from the circumference of conductive via 40 (FIGS. 7A, 7B, 7E, and 7G) to the outer circumference of first signal line 10 (FIGS. 7A, 7D, 7E, 7G) is 25 μm, and minimum distance L7 (FIG. 7B) from the circumference of conductive via 40 (FIGS. 7A, 7B, 7E, and 7G) to the outer circumference of second signal line 11 (FIGS. 7B, 7E-7G) is 0 μm. Further, minimum distance L9 (FIG. 7B) from the circumference of conductive via 41c (FIGS. 7A-7D and 7H) to the outer circumference of ground pattern 50 (FIGS. 7B, 7D, and 7H) on the second coplanar line side is 25 μm. Minimum distance L10 (FIG. 7A) from the circumference of conductive via 41a (FIGS. 7A-7C, 7E, and 7H) to the outer circumference of planar ground pattern 30a (FIGS. 7A, 7D, 7E, and 7H) on the first ground pattern 30b (FIGS. 7A, 7D, and 7E) side is 25 μm. Minimum distance L11 (FIG. 7B) from the circumference of conductive via 41a (FIGS. 7A-7C, 7E, and 7H) to the outer circumference of planar ground pattern 32 (FIGS. 7B, 7E, and 7H) on the ground pattern 50 (FIGS. 7B, 7D, and 7H) side is 25 μm. Finally, the effective relative dielectric constant $\in_1$, of the first coplanar lines is 3.892, and the effective relative dielectric constant $\in_2$ of the second coplanar lines is 7.1.

When these numerical conditions are substituted in Formula (5) that was explained in the first embodiment, the left side becomes:

$$\sqrt{3.892} \times \{(135-25)+150+25\times 2\} + \sqrt{7.1} \times \{(106-0)+135\times 2+25\times 2+150+250\} = 2658 \text{ μm}$$

As a result, in the present embodiment, planar ground pattern 30a (FIGS. 7A, 7D, 7E, and 7H) and first ground pattern 30b (FIGS. 7A, 7D, and 7E) that are on the first wiring layer are separated such that 2658 μm<λ0/2 is satisfied. Considering a case in which the left side and right side are equal in the relational expression 2658 μm<λ0/2, when λ0=2× 2658×10$^{-6}$, f=56×10$^9$ Hz=56 GHz is calculated by means of Formula (6) that was explained in the first embodiment. In other words, when the above-described first separation width is 300 μm, the frequency range that satisfies 2658 μm<λ0/2 is less than 56 GHz, and a first separation width is set that enables an improvement of reflection characteristics up to the level of 56 GHz.

When the above-described numerical conditions are further substituted in the above-described formula (7) for prescribing the second separation width, the left side becomes:

$$\sqrt{3.892} \times \{(135-25)+2\times 135+250+150+2\times 25\} + \sqrt{7.1} \times \{(106-0)+2\times 25+150\} = 2453 \text{ μm}$$

Thus, in the present embodiment, planar ground pattern 32 (FIGS. 7B, 7E, and 7H) and ground pattern 50 (FIGS. 7B, 7D, and 7H) that are on the second wiring layer are separated such that 2453 μm<λ0/2 is satisfied. Considering a case in which the left side and right side are equal in the relational expression 2453 μm<λ0/2, if λ0=2×2453×10-6, f=61×10$^9$ Hz=61 GHz is calculated from the above-described formula (6). In other words, when the above described second separation width is 300 μm, the frequency range that satisfies 2453 μm<λ0/2 is less than 61 GHz, and a second separation width is set that enables an improvement of the reflection characteristics up to the level of 61 GHz.

In addition, a comparative example that was described in the above-described first embodiment in which planar ground pattern 30a of the first coplanar lines and first ground pattern 30b of the upper layer of the second coplanar lines are not separated and that was described the present embodiment were constructed by the above-described numerical conditions and a comparison of reflection characteristics carried out. In the present embodiment that was compared, ground patterns 30a (FIGS. 7A, 7D, 7E, and 7H) and 30b (FIGS. 7A, 7D, and 7E) as well as ground patterns 32 (FIGS. 7B, 7E, and 7H) and 50 (FIGS. 7B, 7D, and 7H) are separated by slit-shaped separation widths of 300 μm as described above.

Figure 8:
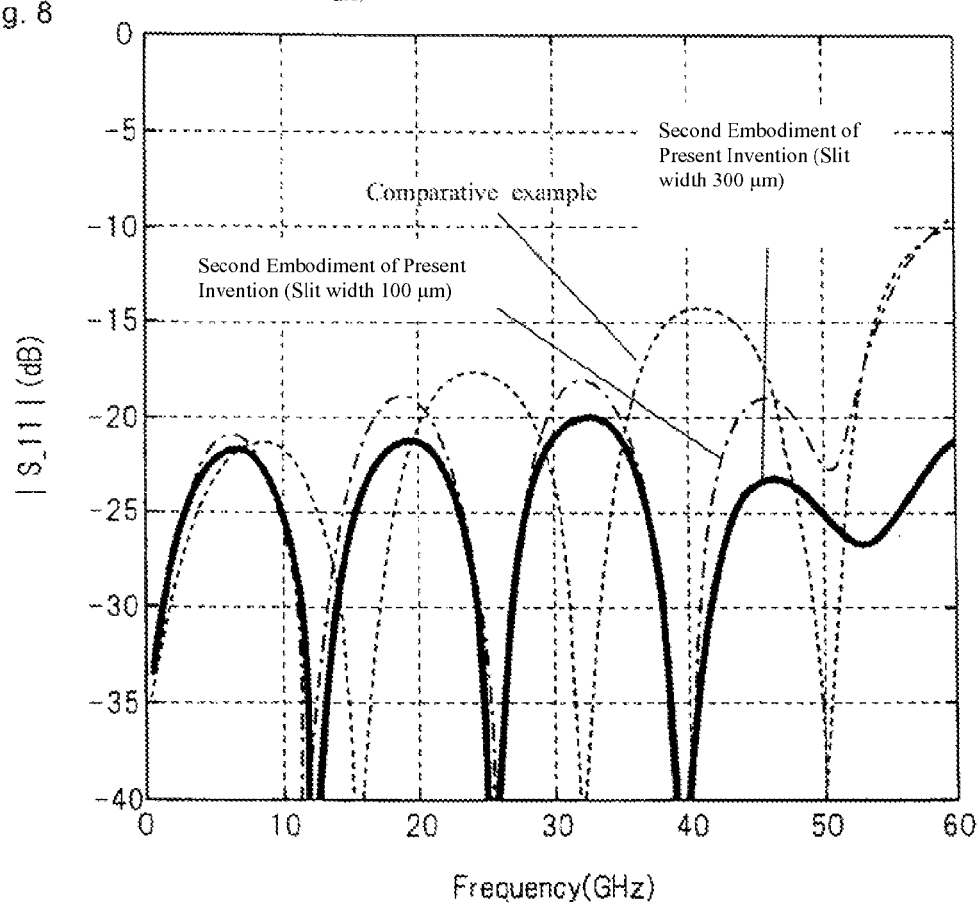
FIG. 8 shows the results of electromagnetic field analysis in which a comparison of the input reflection characteristics of a comparative example and the second embodiment was carried out.

FIG. 8 shows the results of electromagnetic field analysis of these examples. In particular, FIG. 8 plots the S parameter |S_11|, measured in decibels (dB), which represents the degree of reflection of the signal, against frequency of the signal, measured in gigahertz (GHz). FIG. 8 shows the plot for the Comparative example (in which planar ground pattern 30a of the first coplanar lines and first ground pattern 30b of the second coplanar lines are not separated), the plot for the Second Embodiment of Present Invention (with the ground patterns 30a (FIGS. 7A, 7D, 7E, and 7H) and 30b (FIGS. 7A, 7D, and 7E) separated by a 300 μm slit-shaped separation width, and the plot for the Second Embodiment of Present Invention (with the ground patterns 30a (FIGS. 7A, 7D, 7E, and 7H) and 30b (FIGS. 7A, 7D, and 7E) separated by a 100 μm slit-shaped separation width). As can be understood from this figure, an improvement in reflection characteristics is obtained by means of the present embodiment over a broad band from a low-frequency region to close to 60 GHz. The greater the separation width, the broader the band over which an improvement of reflection characteristics is exhibited. Essentially, the S parameter |S_11| (dB), that represents the degree of reflection in FIG. 8, is reduced to a lower degree from a low-frequency region to close to 53 GHz in the case (Second Embodiment of Present Invention) of a slit width of 100 μm than in the comparative example (in which planar ground pattern 30a of the first coplanar lines and first ground pattern 30b of the second coplanar lines are not separated), and is reduced to a lower degree from a low-frequency region to close to 60 GHz in the case (Second Embodiment of Present Invention) of a slit width of 300 μm than the comparative example (in which planar ground pattern 30a of the first coplanar lines and first ground pattern 30b of the second coplanar lines are not separated).

Third Embodiment

Figure 9A:
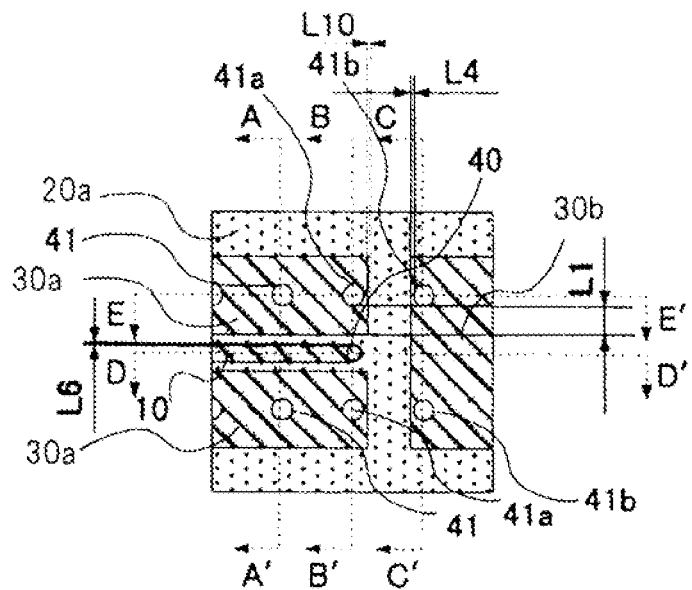
FIG. 9A is a plan view showing the first wiring layer of the high-frequency wiring board of the third embodiment.
Figure 9B:
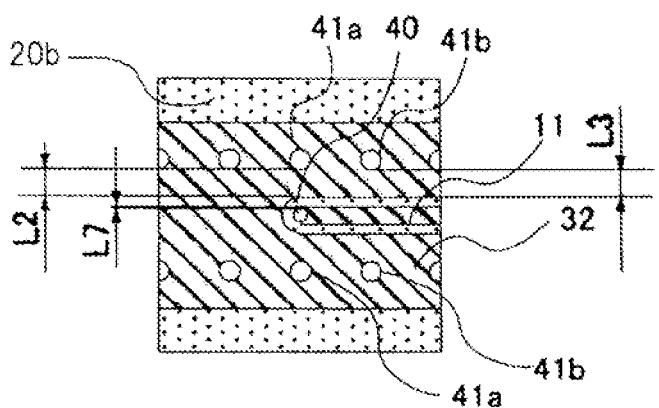
FIG. 9B is a plan view showing the second wiring layer of the high-frequency wiring board of the third embodiment.
Figure 9C:
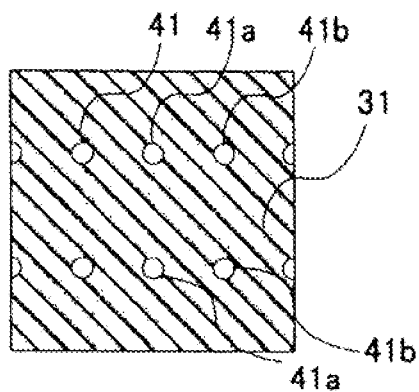
FIG. 9C is a plan view showing the third wiring layer of the high-frequency wiring board of the third embodiment.
Figure 9D:
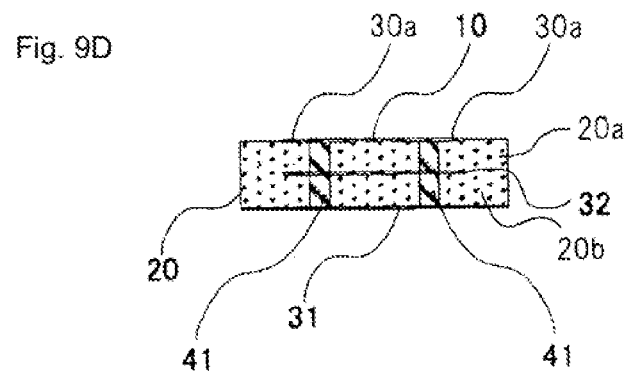
FIG. 9D is a sectional view of the high-frequency wiring board taken along line A-A' of FIG. 9A.
Figure 9E:
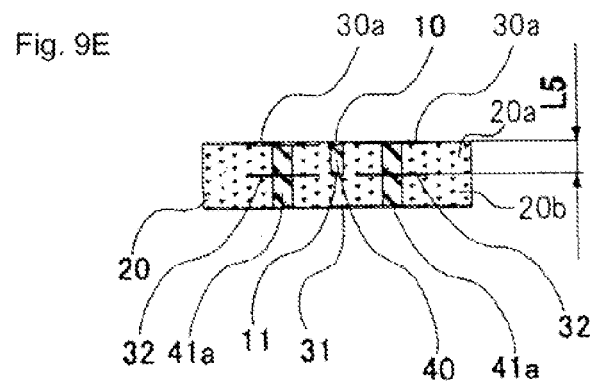
FIG. 9E is a sectional view of the high-frequency wiring board taken along line B-B' of FIG. 9A.
Figure 9F:
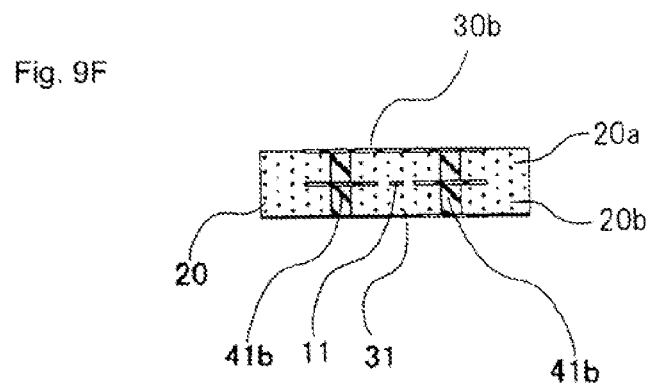
FIG. 9F is a sectional view of the high-frequency wiring board taken along line C-C' of FIG. 9A.
Figure 9G:
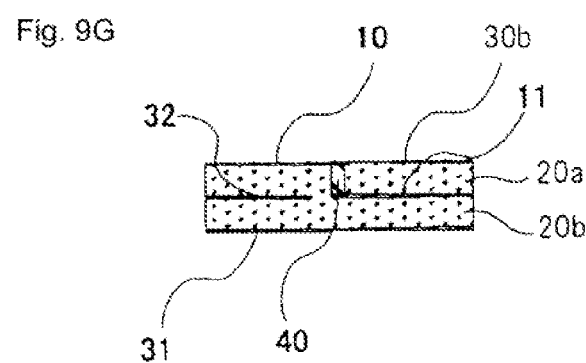
FIG. 9G is a sectional view of the high-frequency wiring board taken along line D-D' of FIG. 9A.
Figure 9H:
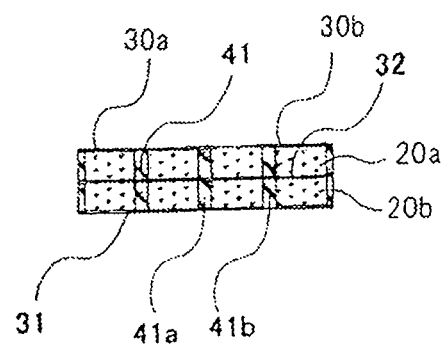
FIG. 9H is a sectional view of the high-frequency wiring board taken along line E-E' of FIG. 9A.

FIGS. 9A-9H show the configuration of a high-frequency wiring board according to the third embodiment of the present invention. More specifically, FIG. 9A is a plan view showing the first wiring layer of the high-frequency wiring board of the present embodiment, FIG. 9B is a plan view of the second wiring layer, and FIG. 9C is a plan view of the third wiring layer. FIG. 9D is a board sectional view taken along line A-A' of FIG. 9A, FIG. 9E is a board sectional view taken along line B-B' of FIG. 9A, FIG. 9F is a board sectional view taken along line C-C' of FIG. 9A, FIG. 9G is a board sectional view taken along line D-D' of FIG. 9A, and FIG. 9H is a board sectional view taken along line E-E' of FIG. 9A. In each figure, the same reference numbers are used for functional parts that are the same as the constituent elements shown in FIGS. 1A-1D.

The high-frequency wiring board of the present embodiment is made up from dielectric wiring board 20 realized by stacking two dielectric layers 20a (FIGS. 9A, 9D-9H) and 20b (FIGS. 9B and 9D-9H). First coplanar lines are formed on the upper surface of first dielectric layer 20a (FIGS. 9A, 9D-9H) that is the obverse surface (first wiring layer) (FIG. 9A) of dielectric wiring board 20 (FIGS. 9D-9F). These first coplanar lines are made up from first signal line 10 (FIGS. 9A, 9D, 9E, 9G) and planar ground pattern 30a (FIGS. 9A, 9D, 9E, and 9H) that is formed on the same layer as first signal line 10 (FIGS. 9A, 9D, 9E, 9G) and that encloses first signal line 10 (FIGS. 9A, 9D, 9E, 9G) on two sides. Second coplanar lines are formed on the upper surface of second dielectric layer 20b (FIGS. 9B and 9D-9H) that is an internal layer (second wiring layer) (FIG. 9B) of dielectric wiring board 20 (FIGS. 9D-9F). The second coplanar lines are made up from second signal line 11 (FIGS. 9B, 9E-9G) and planar ground pattern 32 (FIGS. 9B, 9D, 9E, and 9H) that is formed on the same layer as second signal line 11 (FIGS. 9B, 9E-9G) and that encloses second signal line 11 (FIGS. 9B, 9E-9G) on two sides. Planar ground patterns 30a (FIGS. 9A, 9D, 9E, and 9H) and 32 (FIGS. 9B, 9D, 9E, and 9H) of the first and second coplanar lines may also be formed on only one of the two positions that enclose the signal lines.

First signal line 10 (FIGS. 9A, 9D, 9E, 9G) of the first coplanar lines and second signal line 11 (FIGS. 9B, 9E-9G) of the second coplanar lines that is on a different wiring layer than first signal line 10 (FIGS. 9A, 9D, 9E, 9G) are connected by conductive via 40 (FIGS. 9A, 9B, 9E, and 9G) at the line end of each signal line.

Planar first ground pattern 30b (FIGS. 9A, 9F, 9G, and 9H) and planar second ground pattern 31 (FIGS. 9C-9H) are formed on first wiring layer and third wiring layer (the reverse surface of dielectric wiring board 20 (FIGS. 9D-9F)) such that the layer on which second signal line 11 (FIGS. 9B, 9E-9G) is formed is interposed from above and below. This second ground pattern 31 (FIGS. 9C-9H) extends into an area that confronts the first coplanar lines and doubles as a lower-layer ground of the first coplanar lines.

On the other hand, first ground pattern 30b (FIGS. 9A, 9F, 9G, and 9H) is cut off from ground pattern 30a (FIGS. 9A, 9D, 9E, and 9H) without doubling as a ground pattern of the first coplanar lines as in the background art. More specifically, planar ground pattern 30a (FIGS. 9A, 9D, 9E, and 9H) of the first coplanar lines and first ground pattern 30b (FIGS. 9A, 9F, 9G, and 9H) of the upper layer of the second coplanar lines are separated by way of a predetermined width (dielectric width) in the direction of the extension of the second coplanar lines from the vicinity of the connection between first signal line 10 (FIGS. 9A, 9D, 9E, 9G) and conductive via 40 (FIGS. 9A, 9B, 9E, and 9G.

Further, planar ground pattern 30a (FIGS. 9A, 9D, 9E, and 9H) of the first coplanar lines and second ground pattern 31 (FIGS. 9C-9H) that doubles as the lower layer ground of the first coplanar lines are interconnected by a plurality of conductive vias 41 (FIGS. 7A, 9C, 9D, and 9H) that are arranged at predetermined spacing along the direction of signal transmission of the first coplanar lines. However, of the plurality of conductive vias 41 (FIGS. 7A, 9C, 9D, and 9H), conductive vias 41a (FIGS. 9A-9C, 9E, and 9H) in the vicinity of the connection of first signal line 10 (FIGS. 9A, 9D, 9E, 9G) and second signal line 11 (FIGS. 9B, 9E-9G) also interconnect between planar ground pattern 30a (FIGS. 9A, 9D, 9E, and 9H) of the first coplanar lines and planar ground pattern 32 (FIGS. 9B, 9D, 9E, and 9H) of the second coplanar lines.

In addition, first ground pattern 30b (FIGS. 9A, 9F, 9G, and 9H) that is on the upper layer of the second coplanar lines, planar ground pattern 32 (FIGS. 9B, 9D, 9E, and 9H) of the second coplanar lines, and second ground pattern 31 (FIGS. 9C-9H) are further interconnected by a plurality of conductive vias 41 (FIGS. 7A, 9C, 9D, and 9H) (41b) (FIGS. 9A-9C, 9F, 9H) that are arranged at a predetermined spacing along the direction of signal transmission of the second coplanar lines.

The configuration above is the same as the first embodiment, but the following changes have been made to the first embodiment in the present embodiment. Specifically, planar ground pattern 32 (FIGS. 9B, 9D, 9E, and 9H) of the second coplanar lines is formed over the entire region that confronts the first coplanar lines and doubles as the lower-layer ground of the first coplanar lines. In other words, planar ground pattern 32 (FIGS. 9B, 9D, 9E, and 9H) is not only formed at positions on both sides that enclose second signal line 11 (FIGS. 9B, 9E-9G), but is also formed in areas that confront areas in which the first coplanar lines are formed. In addition, when compared with the second embodiment, as shown in FIG. 7B, the second embodiment has a ground pattern 50 of the lower layer of the first coplanar lines and a planar ground pattern 32 (FIGS. 9B, 9D, 9E, and 9H) of the second coplanar lines of the same layer that are separated, whereas in the third embodiment, as shown in FIG. 9B, planar ground pattern 32 (FIGS. 9B, 9D, 9E, and 9H) is a continuous ground pattern.

Planar ground pattern 32 (FIGS. 9B, 9D, 9E, and 9H) of the second coplanar lines that doubles as lower-layer ground of the first coplanar lines is electrically connected by means of a plurality of conductive vias 41 (FIGS. 7A, 9C, 9D, and 9H) that are arranged at a predetermined spacing along the direction of signal transmission to both planar ground pattern 30a (FIGS. 9A, 9D, 9E, and 9H) and second ground pattern 31 (FIGS. 9C-9H) of the first coplanar lines.

During signal transmission from the first coplanar lines to the second coplanar lines in the high-frequency transmission lines of this type of high-frequency wiring board, the high-frequency paths of the high-frequency current that is propagated in first ground pattern 30b (FIGS. 9A, 9F, 9G, and 9H) of the upper layer of the second coplanar lines are restricted to one path, as in the first embodiment. In this way, phase interference of the high-frequency current that is propagated in first ground pattern 30b (FIGS. 9A, 9F, 9G, and 9H) does not occur, whereby an improvement can be achieved for reflection characteristics that progressively deteriorate from low frequencies to high frequencies.

This type of effect can be obtained if planar ground pattern 30a (FIGS. 9A, 9D, 9E, and 9H) of the first coplanar lines and first ground pattern 30b (FIGS. 9A, 9F, 9G, and 9H) of the upper layer of the second coplanar lines are separated, and this separation portion may be of any form. In other words, the confronting sides that form the separation portion between planar ground pattern 30a (FIGS. 9A, 9D, 9E, and 9H) and first ground pattern 30b (FIGS. 9A, 9F, 9G, and 9H) need not be formed at a fixed spacing or in parallel as shown in the FIG. 9A.

In addition, in a configuration in which planar ground pattern 30a (FIGS. 9A, 9D, 9E, and 9H) and first ground pattern 30b (FIGS. 9A, 9F, 9G, and 9H) are separated at a width of fixed spacing, a further improvement of reflection characteristics is obtained by prescribing the upper limit of the separation width between planar ground pattern 30a (FIGS. 9A, 9D, 9E, and 9H) and first ground pattern 30b (FIGS. 9A, 9F, 9G, and 9H) as the spacing of conductive vias 41 (FIGS. 7A, 9C, 9D, and 9H) (the arrangement spacing of conductive vias 41a (FIGS. 9A-9C, 9E, and 9H) and 41b (FIGS. 9A-9C, 9F, 9H)) formed in the second coplanar lines. The reasons for this improvement as well as the method of calculating the via spacing are as described in the first embodiment.

The above-described separation width can be prescribed as shown below, as in the first embodiment. Specifically, at the time of transmission of a signal from the first coplanar lines to the second coplanar lines, conditions are preferable such that a large divergence does not occur in the electrical path length difference (electrical length difference calculated by the effective relative dielectric constant) between the high-frequency current that is propagated through ground patterns and the high-frequency current that is propagated through signal lines, and the separation width is therefore prescribed within a range in which phases do not invert for the high-frequency currents on the ground pattern side and signal line side at a particular wavelength λ0 (the minimum wavelength (maximum frequency) of the desired signal band).

Specifically, planar ground pattern 30a (FIGS. 9A, 9D, 9E, and 9H) of the first coplanar lines and first ground pattern 30b (FIGS. 9A, 9F, 9G, and 9H) of the second coplanar lines that are provided on the same layer are separated such that formula (5) explained in the first embodiment is satisfied.

The method of prescribing this separation width was described in the first embodiment and explanation is therefore here omitted.

The reflection characteristics realized by the present embodiment are next described.

When inspecting the reflection characteristics, the same numerical conditions as the first embodiment were adopted with the exception of the following alterations. Specifically, because a ground pattern is provided on the lower layer of the first coplanar lines in the present embodiment, the gap spacing of first signal line 10 (FIGS. 9A, 9D, 9E, 9G) and planar ground pattern 30a (FIGS. 9A, 9D, 9E, and 9H) was changed to 78 μm.

In the configuration realized by these numerical conditions, planar ground pattern 30a (FIGS. 9A, 9D, 9E, and 9H) of the first coplanar lines and first ground pattern 30b (FIGS. 9A, 9F, 9G, and 9H) of the second coplanar lines that are provided on the same layer are separated by a slit-shaped width of 300 μm midway between conductive vias 41a (FIGS. 9A-9C, 9E, and 9H) and conductive vias 41b (FIGS. 9A-9C, 9F, 9H).

In this case, minimum distance L4 from the circumference of conductive via 41b (FIGS. 9A-9C, 9F, 9H) to the outer circumference of first ground pattern 30b (FIGS. 9A, 9F, 9G, and 9H) on the first coplanar line side is 25 μm, minimum distance L6 from the circumference of conductive via 40 (FIGS. 9A, 9B, 9E, and 9G) to the outer circumference of first signal line 10 (FIGS. 9A, 9D, 9E, 9G) is 25 μm, minimum distance L7 from the circumference of conductive via 40 (FIGS. 9A, 9B, 9E, and 9G) to the outer circumference of second signal line 11 (FIGS. 9B, 9E-9G) is 0 μm, and minimum distance L10 from the circumference of conductive via 41a (FIGS. 9A-9C, 9E, and 9H) to the outer circumference of planar ground pattern 30 on the first ground pattern 30b (FIGS. 9A, 9F, 9G, and 9H) side is 25 μm. In addition, the effective relative dielectric constant $\in_1$ of the first coplanar lines is 3.892, and the effective relative dielectric constant $\in_2$ of the second coplanar lines is 7.1.

When these numerical conditions are substituted in formula (5) described in the first embodiment, the left side is:

$$\sqrt{3.892} \times \{(135-25)+150+25 \times 2\} + \sqrt{7.1} \times \{(106-0)+135 \times 2+25 \times 2+150+250\} = 2658 \text{ μm}$$

As a result, in the present embodiment, planar ground pattern 30a (FIGS. 9A, 9D, 9E, and 9H) and first ground pattern 30b (FIGS. 9A, 9F, 9G, and 9H) that are on the first wiring layer are separated such that 2658 μm<λ0/2 is satisfied. In other words, when the separation width is 300 μm, the frequency range that satisfies 2658 μm<λ0/2 is less than 56 GHz based on formula (6) that was explained in the first embodiment, and a separation width is set that enables an improvement in reflection characteristics up to the level of 56 GHz.

In addition, the present embodiment and a comparative example described in the aforementioned first embodiment in which planar ground pattern 30a of the first coplanar lines and first ground pattern 30b of the upper layer of the second coplanar lines are not separated were constructed by the above-described numerical conditions and a comparison of input reflection characteristics carried out. In the present embodiment that was compared, ground patterns 30a (FIGS. 9A, 9D, 9E, and 9H) and 30b (FIGS. 9A, 9F, 9G, and 9H) were separated by a slit-shaped separation width of 300 μm as previously described, and moreover, planar ground pattern 32 (FIGS. 9B, 9D, 9E, and 9H) of the second coplanar lines doubled as the lower-layer ground of the first coplanar lines.

Figure 10:
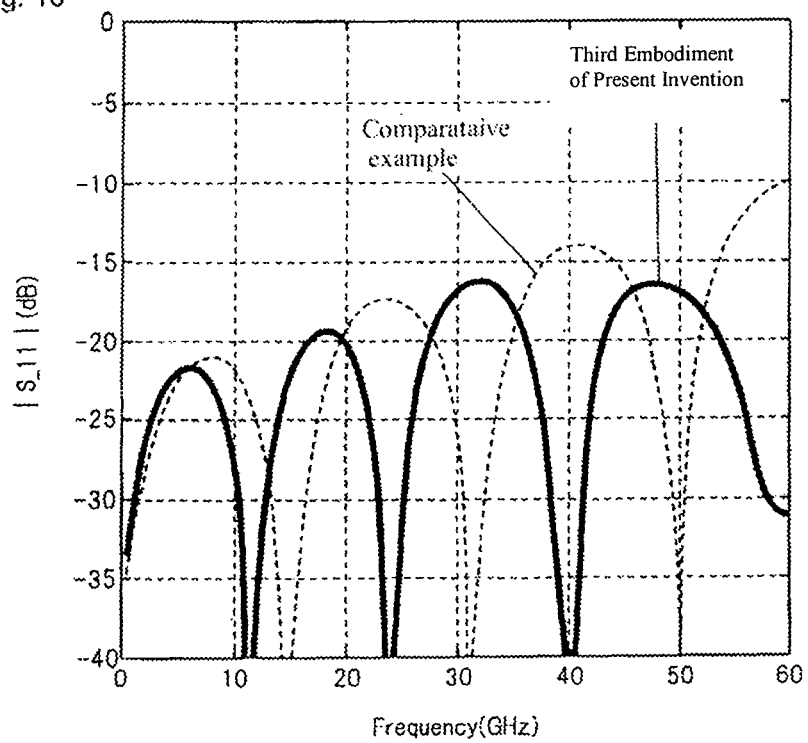
FIG. 10 shows the results of electromagnetic field analysis in which a comparison of the input reflection characteristics of a comparative example and the third embodiment was carried out.

FIG. 10 shows the results of electromagnetic field analysis. In particular, FIG. 10 plots the S parameter |S_11|, measured in decibels (dB), which represents the degree of reflection of the signal, against frequency of the signal, measured in gigahertz (GHz). FIG. 10 shows the plot for the Comparative example (in which planar ground pattern 30a of the first coplanar lines and first ground pattern 30b of the second coplanar lines are not separated) and the plot for the Third Embodiment of Present Invention (with the ground patterns 30a (FIGS. 9A, 9D, 9E, and 9H) and 30b (FIGS. 9A, 9F, 9G, and 9H) separated by a 300 μm slit-shaped separation width. As can be understood from the figure, the effect of improving the reflection characteristics was obtained by the present embodiment (Third Embodiment of Present Invention) over a broad band from a low frequency region to close to 60 GHz.

In each of the embodiments of the present invention, when a signal is being transmitted from the first coplanar lines to the second coplanar lines, the high-frequency current paths that are propagated in a first ground pattern of the upper layer of the second coplanar lines are limited to one. In other words, the high-frequency current path propagated to the first ground pattern at the time of signal transmission to the second coplanar lines is the only path from a planar ground pattern of the first coplanar lines to the first ground pattern that successively passes by way of second conductive via 41a (FIGS. 9A-9C, 9E, and 9H), the planar ground pattern of the second coplanar lines, and by way of the next second conductive via 41b (FIGS. 9A-9C, 9F, 9H) along the direction of signal transmission.

Because phase interference of high-frequency currents propagated in the first ground pattern is thus suppressed, an improvement can be attained in reflection characteristics that progressively deteriorate from low frequencies to high frequencies.

In addition, a further improvement can be obtained in reflection characteristics that progressively deteriorate from low frequencies to high frequencies by decreasing the difference of the phase of the high-frequency current that is propagated through the first ground pattern and the phase of the high-frequency current that is propagated through signal lines, i.e., the difference in electrical length that is converted to wavelength.

Other Embodiments

In each of the above-described embodiments, conductive vias are used as a means of connecting different layers, but the present invention is not limited to this form, and electrical connection means having conductivity such as through-holes can also be applied. In addition, explanation regarded a case of a three-layer wiring board, but a multilayer wiring board of three or more layers can also be applied, and further, a configuration can also be applied in which first signal line 10 and ground patterns 30a and 30b are in the interior of dielectric wiring board 20.

In FIGS. 2A to 2H, FIGS. 7A to 7H and FIGS. 9A to 9H first signal line 10 (FIGS. 2A, 2D, 2E, and 2G, FIGS. 7A, 7D, 7E, 7G, and FIGS. 9A, 9D, 9E, 9G) and second signal line 11 (FIGS. 2B, 2F, and 2G, FIGS. 7B, 7E-7G, and FIGS. 9B, 9E-9G) need not be on a straight line and may diverge somewhat. In such cases, the confronting sides that prescribe the separation width between planar ground pattern 30a (FIGS. 2A, 2D, 2E, and 2H, FIGS. 7A, 7D, 7E, and 7H, and FIGS. 9A, 9D, 9E, and 9H) of the first coplanar lines and first ground pattern 30b (FIGS. 2A, 2F, 2G and 2H, FIGS. 7A, 7D, and 7E, and FIGS. 9A, 9F, 9G, and 9H) of the upper layer of the second coplanar lines and the confronting sides that prescribe the separation width between planar ground pattern 32 (FIGS. 2B, 2E, and 2H, FIGS. 7B, 7E, and 7H, and FIGS. 9B, 9D, 9E, and 9H) of the second coplanar lines and third ground pattern 50 (FIGS. 7B, 7D, and 7H) need not be formed at a fixed spacing.

The high-frequency wiring board of the present invention that is based on each of the embodiments can be applied as the wiring board of a high-frequency module that is incorporated in, for example, a portable telephone device, a PDA (Personal Digital Assistant) terminal, and many other electronic devices.

Figure 11:
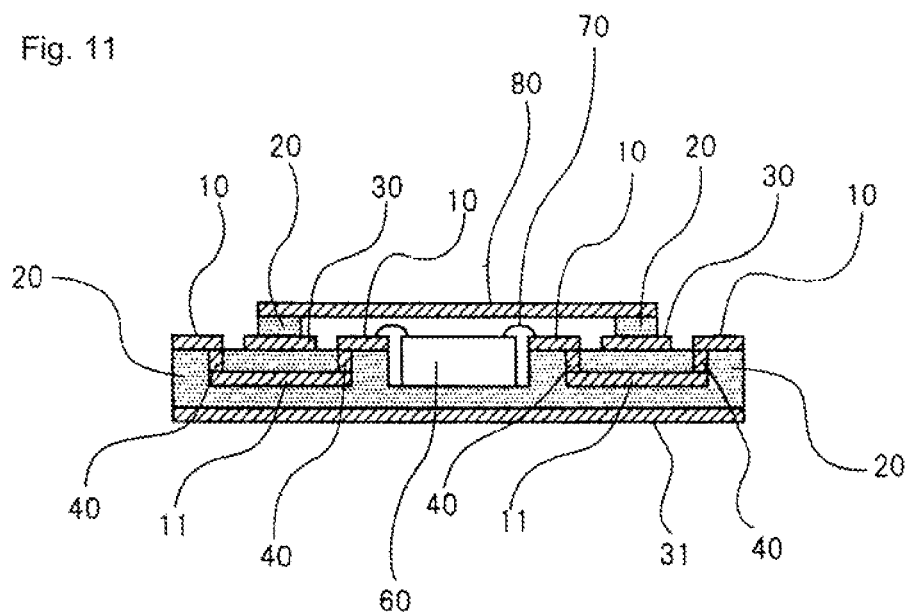
FIG. 11 is a sectional view taken along a signal line of an example of a module that uses the high-frequency wiring board of the present invention.
Figure 12:
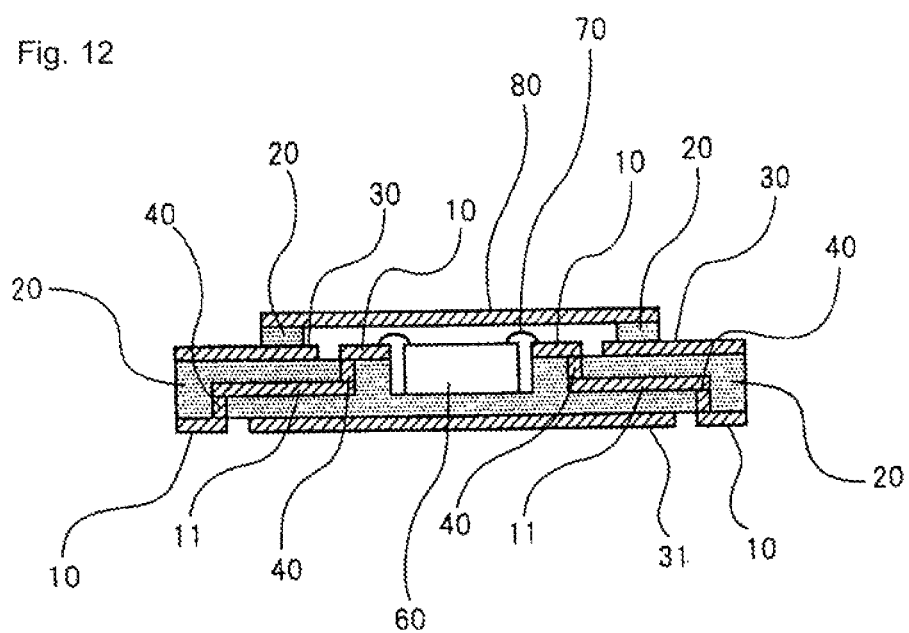
FIG. 12 is a sectional view taken along a signal line of an example of a module that uses the high-frequency wiring board of the present invention.

For example, high-frequency modules as shown in FIG. 11 and FIG. 12 are obtained by providing depressions in dielectric wiring board 20, accommodating LSI chip 60 that is an electronic device that operates by a clock signal, and then electrically connecting first signal lines 10 of first coplanar lines that are formed on the obverse surface of dielectric wiring board 20 with bonding wires 70, and then covering LSI chip 60 by cover 80. FIG. 11 shows a configuration in which first signal lines 10 of the first coplanar lines that are connected to LSI chip 60 and first signal lines 10 of the other first coplanar lines that are formed on the same obverse surface of dielectric wiring board 20 are connected by way of second signal lines 11 of second coplanar lines that are formed inside dielectric wiring board 20. Alternatively, FIG. 12 shows a configuration in which first signal lines 10 of first coplanar lines that are connected to LSI chip 60 are connected to first signal lines 10 of other first coplanar lines that are formed on the reverse surface of dielectric wiring board 20 by way of second signal lines 11 of second coplanar lines that are formed inside dielectric wiring board 20.

In either configuration, the configuration is characterized by the separation of a planar ground pattern (not shown) of the first coplanar lines from first ground pattern 30 of the same layer or second ground pattern 31 in the wiring direction from first coplanar lines to second coplanar lines that are connected by conductive vias 40. In addition, although LSI chip 60 is embedded in a high-frequency wiring board in the forms shown in FIG. 11 and FIG. 12, the high-frequency module of the present invention is not limited to this form. Accordingly, the LSI chip may be surface-mounted to the wiring board by the flip-chip connection method or wire-bonding method depending on the application. Alternatively, a form is also possible in which LSI chip 60 is sealed by molded resin without using cover 80.

Although the high-frequency wiring board of the present invention and the high-frequency module that employs this high-frequency wiring board were described by showing a number of embodiments as described hereinabove, the invention of the present application is not limited to these embodiments and is obviously open to various modifications within a range that does not depart from the gist of the invention.

What is claimed is:

1. A high-frequency wiring board comprising:
first coplanar lines provided with a first signal line and a first planar ground pattern formed on the same wiring layer as said first signal line;
second coplanar lines provided with a second signal line formed on a wiring layer that differs from said first signal line, and
a second planar ground pattern formed on the same wiring layer as said second signal line; and
a first ground pattern formed on the same wiring layer as said first coplanar lines;
wherein:
said first coplanar lines and said second coplanar lines are connected such that a signal is transmitted from said first coplanar lines to said second coplanar lines; and
when the signal is being transmitted from said first coplanar lines to said second coplanar lines, a portion of the path of a high-frequency current that is propagated from said first planar ground pattern to said first ground pattern passes only by way of said second planar ground pattern.

2. A high-frequency wiring board comprising:
first coplanar lines provided with a first signal line and a first planar ground pattern formed on the same wiring layer as said first signal line;
second coplanar lines provided with a second signal line formed on a wiring layer that differs from said first signal line, and a second planar ground pattern formed on the same wiring layer as said second signal line; and
a first ground pattern formed on the same wiring layer as said first coplanar lines;
wherein:
said first coplanar lines and said second coplanar lines are connected by a connection between said first signal line and said second signal line; and
said first ground pattern and said first planar ground pattern are physically separated so that the first ground pattern and the first planar ground pattern do not contact each other electrically in the same layer, where a separation region extends along a direction of extension of said second signal line from the connection between said first signal line and said second signal line.

3. The high-frequency wiring board as set forth in claim 2 wherein:
said first signal line in said first coplanar lines is formed in the interior or on the obverse surface of a dielectric wiring board, and said first planar ground pattern is formed on at least one of two side positions that enclose said first signal line; and
said second planar ground pattern in said second coplanar lines is formed on at least one of two side positions that enclose said second signal line.

4. The high-frequency wiring board as set forth in claim 2, wherein said second planar ground pattern is not only formed on at least one of two side positions that enclose said second signal line but also extends into a region, of the same wiring layer as said second coplanar lines, that confronts a region in which said first coplanar lines are formed.

5. A high-frequency module in which a semiconductor integrated circuit chip is mounted on the high-frequency wiring board as set forth in claim 2.

6. A high-frequency wiring board comprising:
first coplanar lines provided with a first signal line and a first planar ground pattern formed on the same wiring layer as said first signal line;
second coplanar lines provided with a second signal line formed on a wiring layer that differs from said first signal line, and a second planar ground pattern formed on the same wiring layer as said second signal line;
a first ground pattern formed on the same wiring layer as said first coplanar lines;
a first conductive via for connecting said first signal line and said second signal line at an end of each signal line so that said first coplanar lines and said second coplanar lines are connected;
a second ground pattern formed on the wiring layer on the opposite side of the layer of said first ground pattern with respect to the wiring layer on which said second coplanar lines are formed; and second conductive vias that are a plurality of second conductive vias arranged at a predetermined spacing along the direction of signal transmission through said first and second coplanar lines, said second conductive vias including:
conductive vias a for connecting said first planar ground pattern and said second planar ground pattern, conductive vias b for connecting said first ground pattern and said second planar ground pattern, and conductive vias c for connecting said first planar ground pattern and said second ground pattern;
wherein
said first ground pattern and said first planar ground pattern are separated by a width,
where a separation region extends along a direction of extension of said second signal line from the vicinity of said first conductive via.

7. The high-frequency wiring board as set forth in claim 6, further comprising:
a third ground pattern formed in a region of the same wiring layer of said second coplanar lines that confronts the region in which said first coplanar lines are formed, and moreover, that is electrically connected by said second conductive vias to both said first planar ground pattern and said second ground pattern;
wherein said third ground pattern is separated from said second planar ground pattern by a width in the direction of transmission of said first coplanar lines from the vicinity of connection of said second signal line and said first conductive via.

8. The high-frequency wiring board as set forth in claim 7, wherein:
when: L8 is the minimum distance from a circumference of, from among the plurality of said second conductive vias provided in said first coplanar lines and excluding said conductive vias a, said conductive via c being closest to said first conductive via, to an outer circumference of said first planar ground pattern on said first signal line side;
L9 is the minimum distance from a circumference of said conductive via c to an outer circumference of said third ground pattern on said second coplanar lines side;
L11 is the minimum distance from a circumference of said conductive via a to an outer circumference of said second planar ground pattern on said third ground pattern side; and
said second planar ground pattern and said third ground pattern provided on the same layer as said second planar ground pattern are separated such that the following relational expression is satisfied:

$$\sqrt{\in_1} \times \{(L1-L6)+2 \times L8+L5+\varphi+2 \times L9\} + \sqrt{\in_2} \times \{(L2-L7)+2 \times L11+\varphi\}$$

$$< \lambda 0/2.$$

9. The high-frequency wiring board as set forth in claim 7, wherein the width between said third ground pattern and said second planar ground pattern that are separated is a width no greater than the spacing of said second conductive vias that is set in said first coplanar lines.

10. The high-frequency wiring board as set forth in claim 6, wherein the width between said first ground pattern and said first planar ground pattern that are separated is a width no greater than the spacing of said second conductive vias that is set in said second coplanar lines.

11. The high-frequency wiring board as set forth in claim 6, wherein:
when: L1 is the minimum distance from a circumference of, from among the plurality of said second conductive vias provided in said first coplanar lines, said conductive via a interconnecting said first planar ground pattern and said second planar ground pattern, to an outer circumference of said first planar ground pattern on said first signal line side;
L2 is the minimum distance from a circumference of said conductive via a to an outer circumference of said second planar ground pattern on said second signal line side;
L3 is the minimum distance from a circumference of, from among said plurality of second conductive vias provided in said second coplanar lines and excluding said conductive vias a, said conductive via b being closest to said first conductive via, to the outer circumference of said second planar ground pattern on said second signal line side;
L4 is the minimum distance from a circumference of said conductive via b to an outer circumference of said first ground pattern on said first coplanar line side;
L5 is the dielectric layer thickness between said first ground pattern and said second planar ground pattern;
L6 is the minimum distance from a circumference of said first conductive via to an outer circumference of said first signal line;
L7 is the minimum distance from the circumference of said first conductive via to an outer circumference of said second signal line;
L10 is the minimum distance from the circumference of said conductive via a to the outer circumference of said first planar ground pattern on said first ground pattern side;
$\in_1$ is the effective relative dielectric constant of said first coplanar lines;
$\in_2$ is the effective relative dielectric constant of said second coplanar lines;
$\varphi$ is the diameter of said second conductive vias; and
$\lambda 0$ is a minimum wavelength in a vacuum in the transmitted signal band; said first planar ground pattern and said first ground pattern that are provided on the same layer as said first planar ground pattern are separated such that the following relational expression is satisfied:

$$\sqrt{\in_1} \times \{(L1-L6)+\varphi+L10 \times 2\} + \sqrt{\in_2} \times \{(L2-L7)+L3 \times 2+L4 \times 2+\varphi+L5\}$$

$$< \lambda 0/2.$$

12. The high-frequency wiring board as set forth in claim 6, further comprising:
a third ground pattern formed in a region of the same wiring layer as said second coplanar lines that confronts the region in which said first coplanar lines are formed;
wherein said third ground pattern is separated from said second planar ground pattern in the direction of transmission of said first coplanar lines from the vicinity of the connection of said first signal line and said second signal line.

* * * * *